(12) United States Patent
Dehe et al.

(10) Patent No.: US 9,516,428 B2
(45) Date of Patent: Dec. 6, 2016

(54) MEMS ACOUSTIC TRANSDUCER, MEMS MICROPHONE, MEMS MICROSPEAKER, ARRAY OF SPEAKERS AND METHOD FOR MANUFACTURING AN ACOUSTIC TRANSDUCER

(71) Applicant: Infineon Technologies AG, Neubiberg (DE)

(72) Inventors: Alfons Dehe, Reutlingen (DE); Guenther Ruhl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 562 days.

(21) Appl. No.: 13/830,111

(22) Filed: Mar. 14, 2013

(65) Prior Publication Data

US 2014/0270271 A1    Sep. 18, 2014

(51) Int. Cl.
| | |
|---|---|
| *H04R 23/00* | (2006.01) |
| *H04R 31/00* | (2006.01) |
| *B81C 1/00* | (2006.01) |
| *B81B 3/00* | (2006.01) |
| *H04R 19/00* | (2006.01) |
| *H04R 7/04* | (2006.01) |

(52) U.S. Cl.
CPC ............ *H04R 23/00* (2013.01); *B81B 3/0018* (2013.01); *B81C 1/00158* (2013.01); *H04R 19/005* (2013.01); *H04R 31/00* (2013.01); *H04R 7/04* (2013.01); *H04R 31/006* (2013.01); *H04R 2307/023* (2013.01)

(58) Field of Classification Search
None
See application file for complete search history.

(56) References Cited

U.S. PATENT DOCUMENTS

| | | | |
|---|---|---|---|
| 8,111,871 | B2 | 2/2012 | Zhang et al. |
| 2006/0050920 | A1 | 3/2006 | Akino |
| 2007/0047746 | A1 | 3/2007 | Weigold et al. |
| 2008/0205668 | A1 | 8/2008 | Torii et al. |
| 2012/0073948 | A1 | 3/2012 | Hurst et al. |
| 2012/0082325 | A1 | 4/2012 | Sakurauchi et al. |
| 2013/0062710 | A1 | 3/2013 | Dehe |
| 2014/0050338 | A1 | 2/2014 | Kasai |

(Continued)

FOREIGN PATENT DOCUMENTS

| | | |
|---|---|---|
| DE | 102010008044 A1 | 8/2011 |
| JP | 2012175509 A | 9/2012 |

(Continued)

OTHER PUBLICATIONS

Wong, C-L., et al., "Characterization of nanomechanical graphene drum structures," Journal of Micromechanics and Microengineering, vol. 20, No. 11, 2010, 13 pages.

*Primary Examiner* — Robert Carpenter
(74) *Attorney, Agent, or Firm* — Slater Matsil, LLP

(57) ABSTRACT

A MEMS acoustic transducer includes a substrate having a cavity therethrough, and a conductive back plate unit including a plurality of conductive perforated back plate portions which extend over the substrate cavity. A dielectric spacer arranged on the back plate unit between adjacent conductive perforated back plate portions, and one or more graphene membranes are supported by the dielectric spacer and extend over the conductive perforated back plate portions.

28 Claims, 25 Drawing Sheets

(56) References Cited

U.S. PATENT DOCUMENTS

2014/0053651 A1    2/2014  Besling et al.
2014/0145276 A1    5/2014  Rombach
2014/0376749 A1*  12/2014  Nielsen .................... H04R 3/04
                                                     381/122

FOREIGN PATENT DOCUMENTS

KR          101058475  B1     8/2011
WO          2007147643 A2    12/2007
WO       WO 2011/142637 A2   11/2011
WO       WO 2013049794 A1 *  4/2013  ............... H04R 7/02

* cited by examiner

|  | Graphene | Silicon |
|---|---|---|
| Young's modulus | ~1100 GPa | ~160 GPa |
| Fracture strength | 125 GPa | ~2-3 GPa |
| Poisson ratio | 0.16 | 0.26 |
| Thickness (per layer) | 0.335 nm | |
| Density | 2260 kg/m$^3$<br>7.57 x 10$^{-7}$ kg·m$^{-2}$ per layer | 2300 kg/m$^3$ |
| Spring constant | 1...5 N/m @ 2...8 nm thickness | |

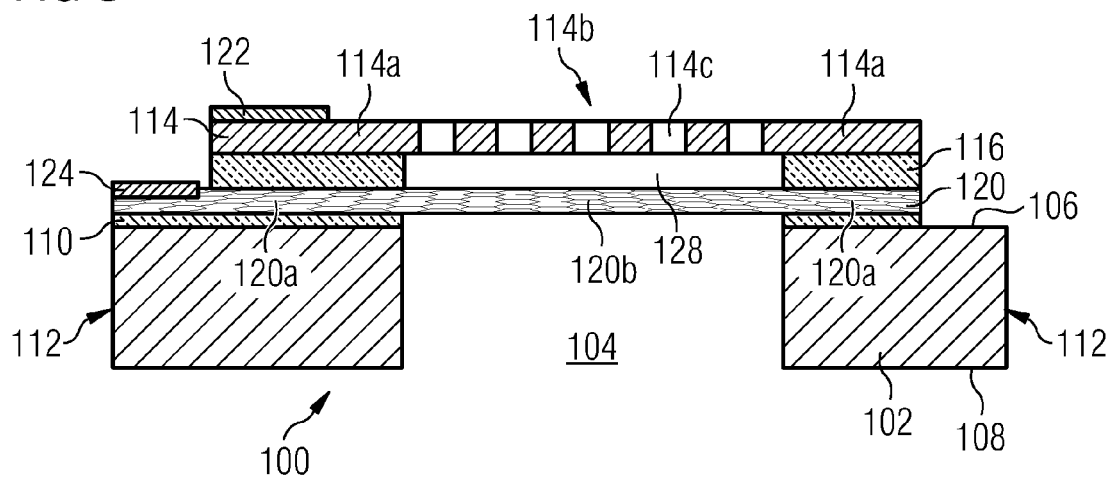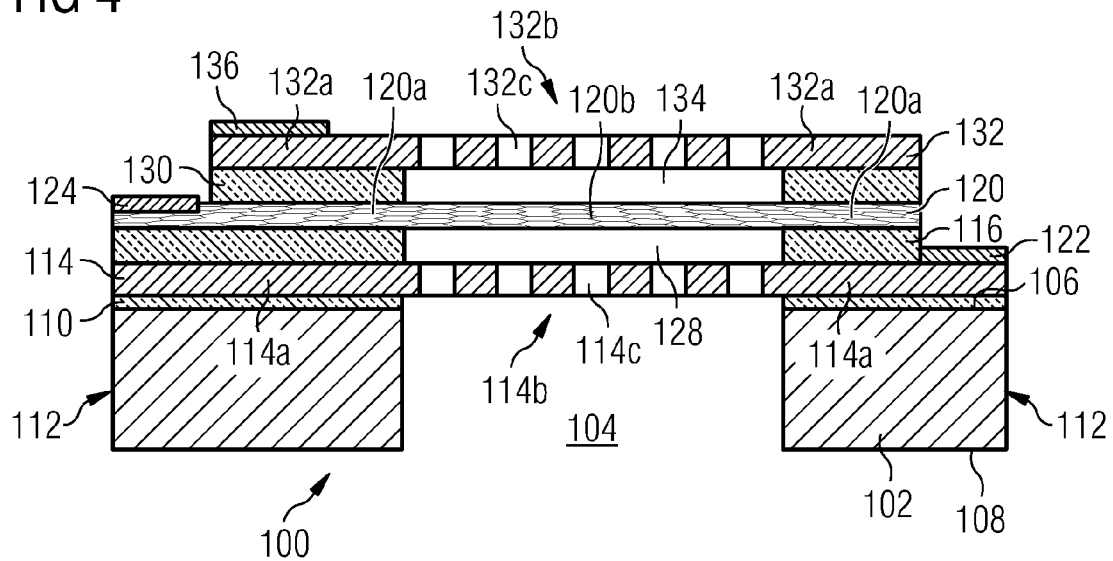

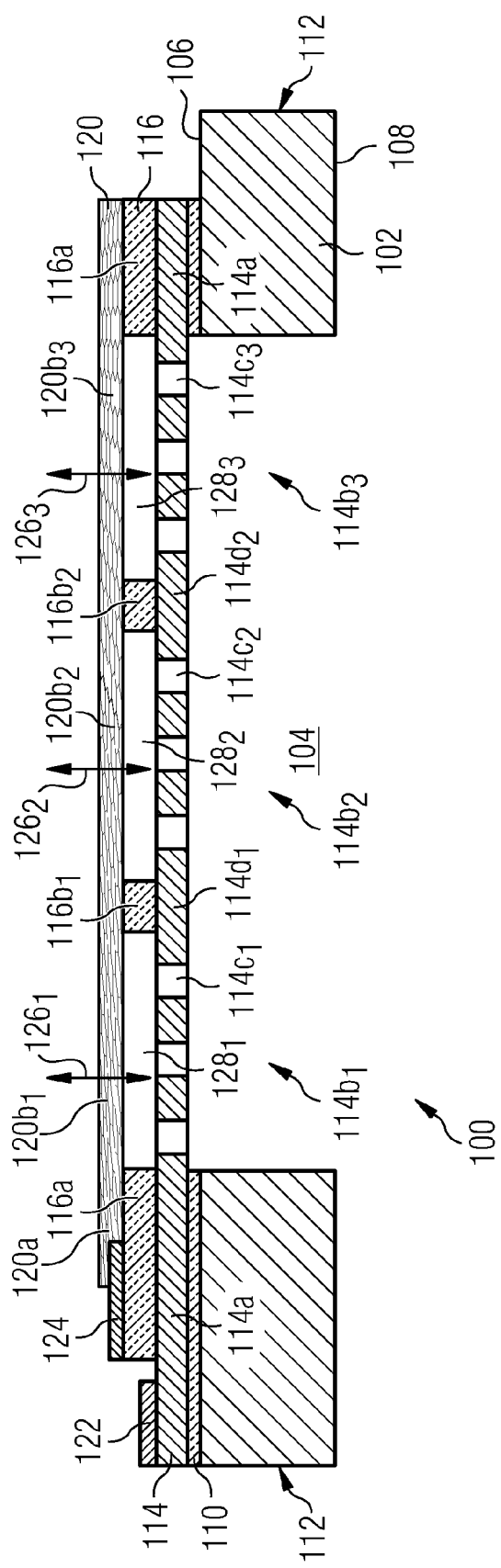

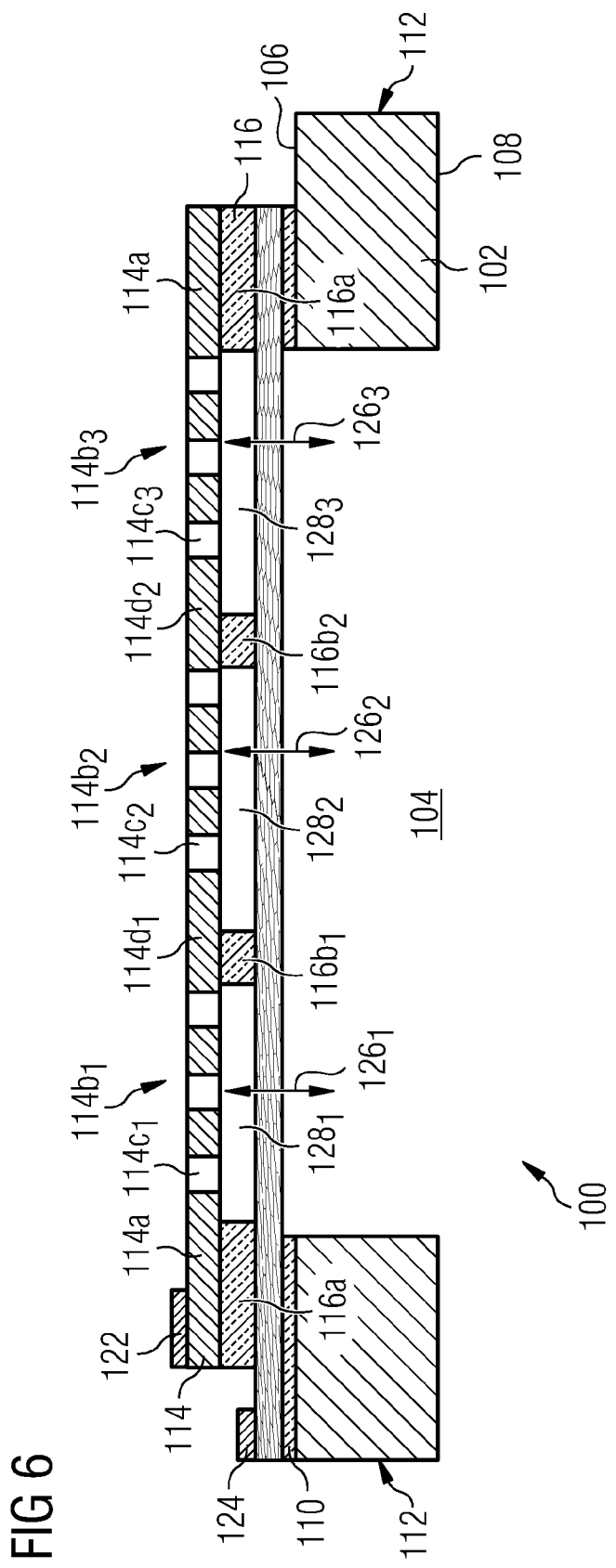

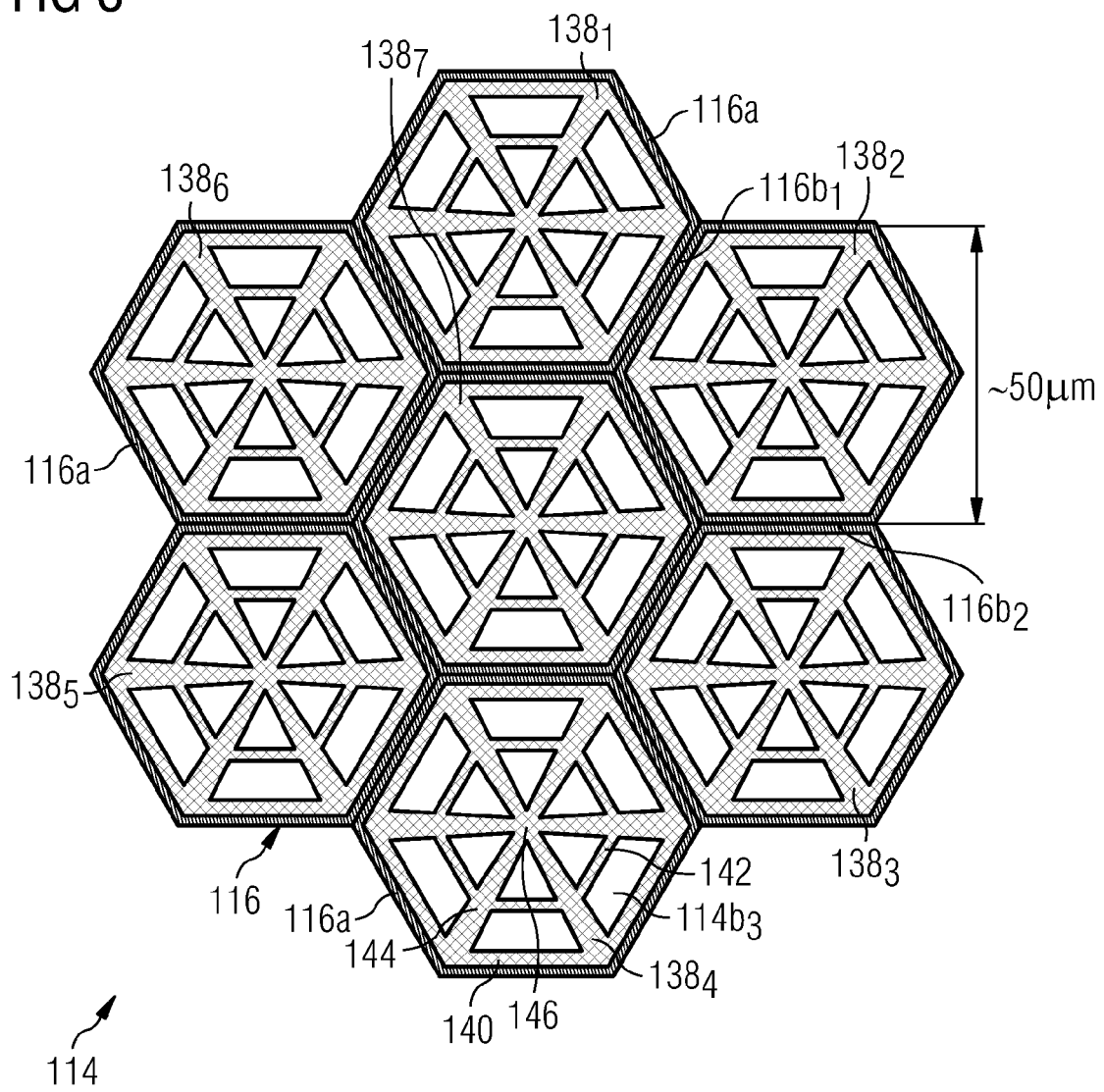

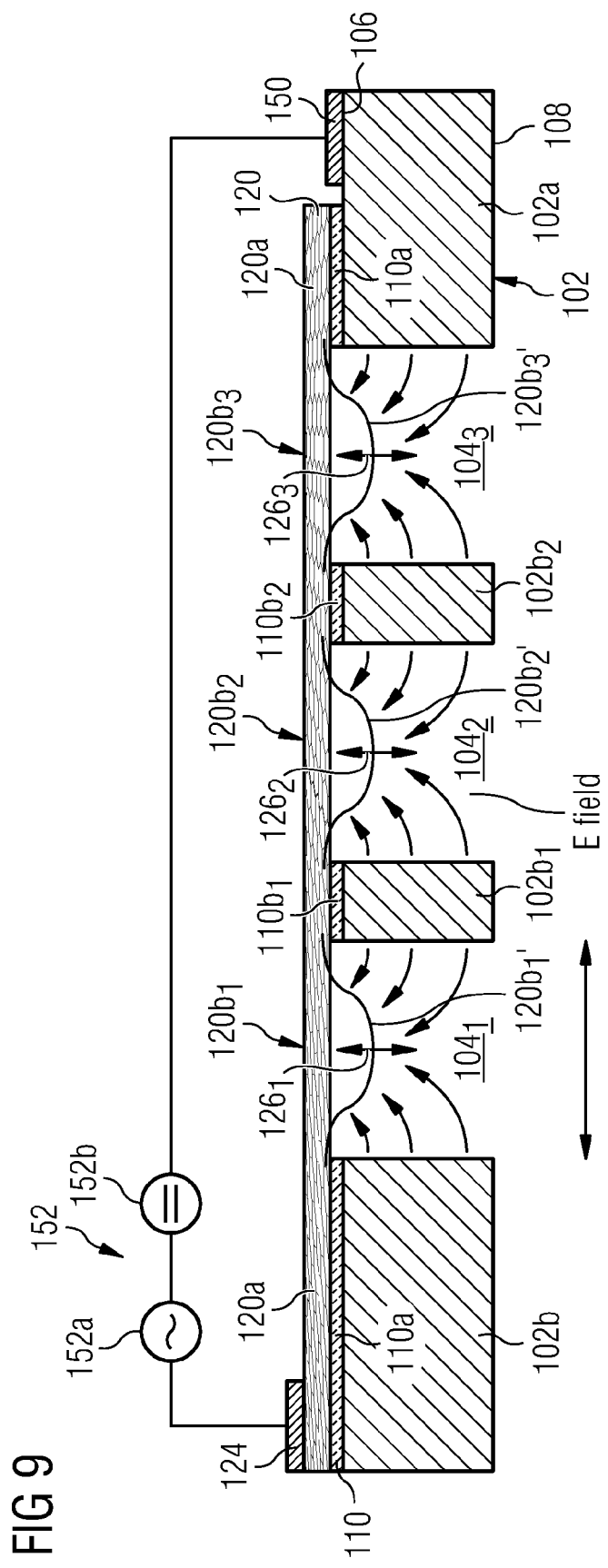

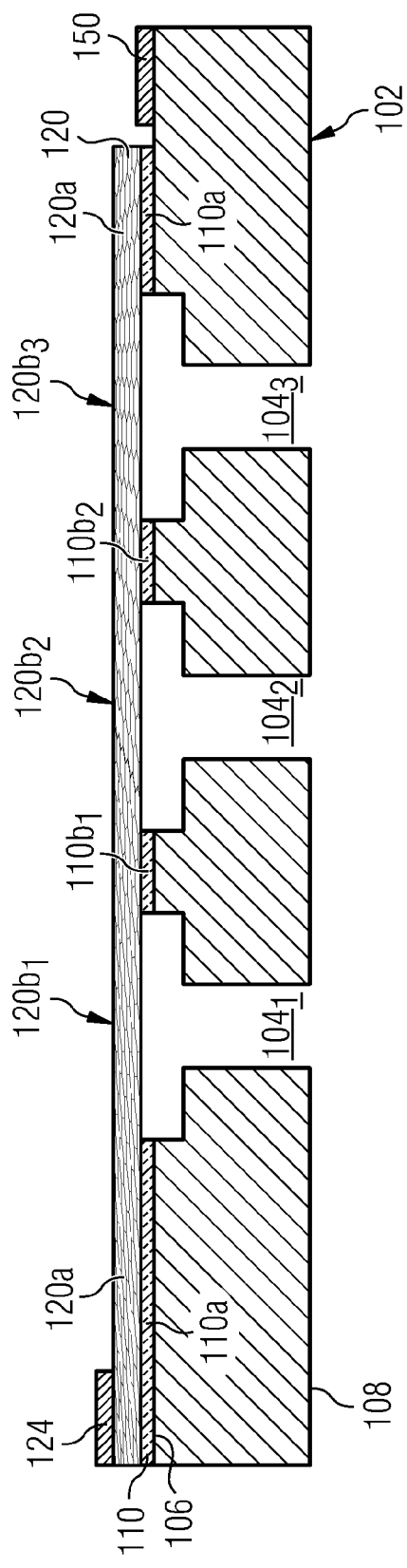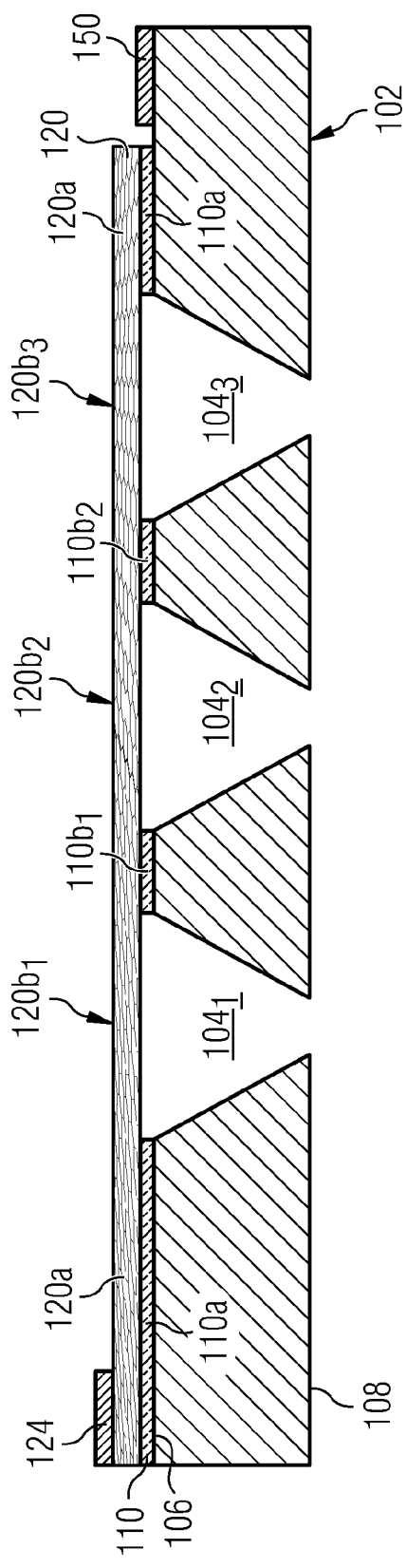

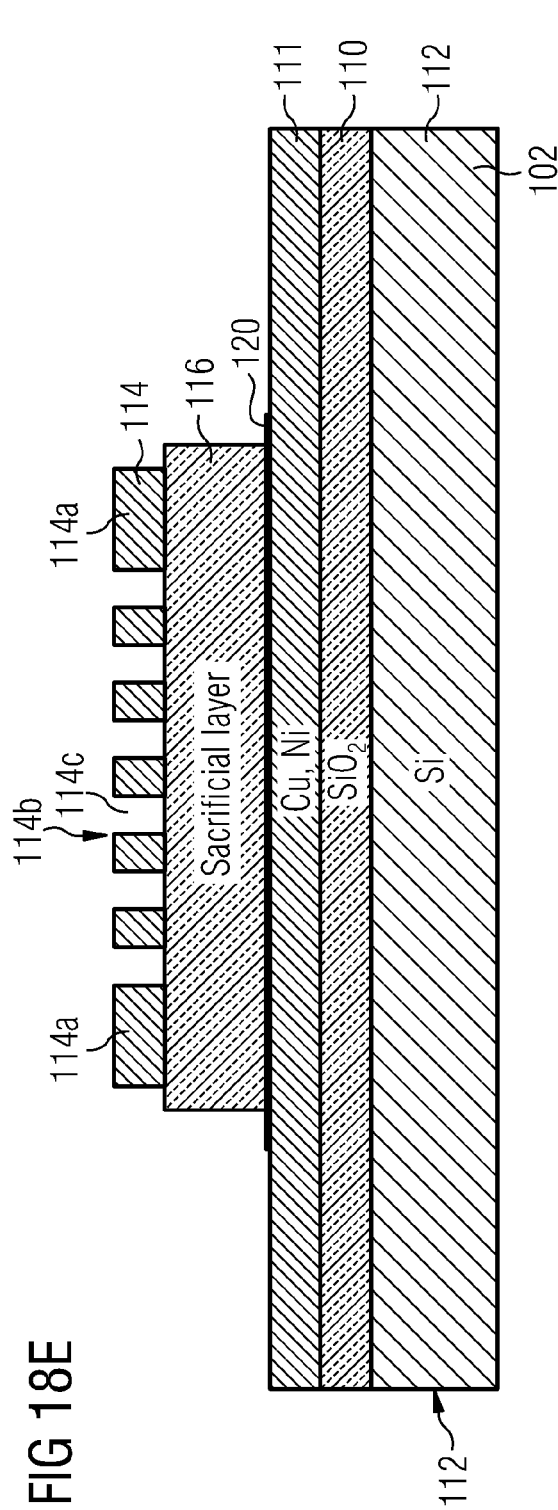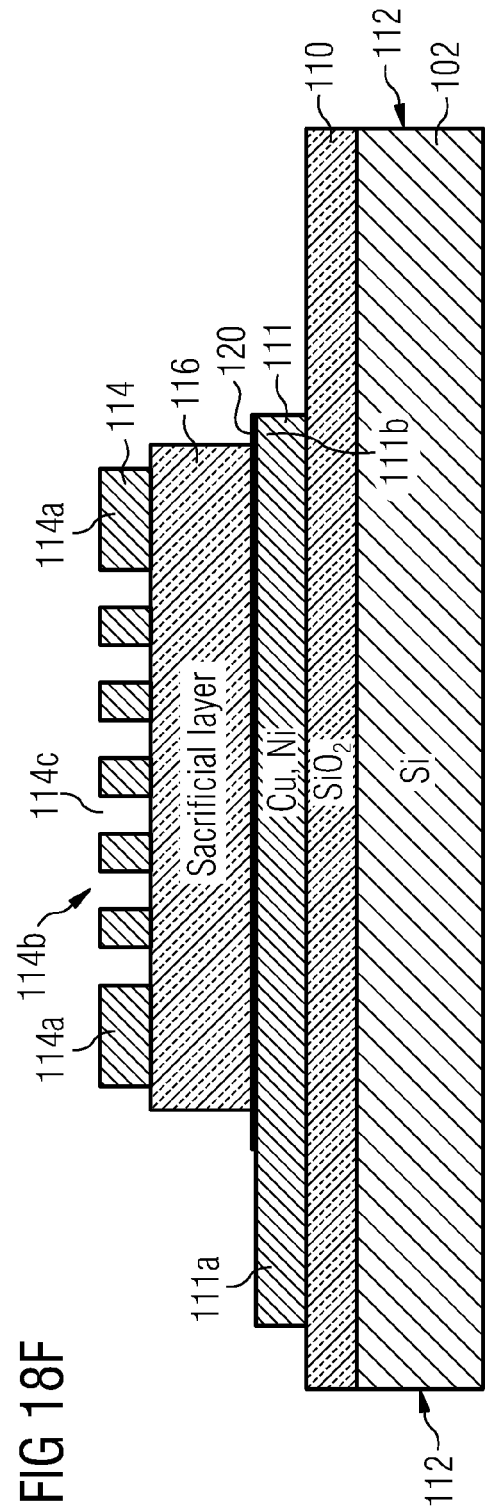

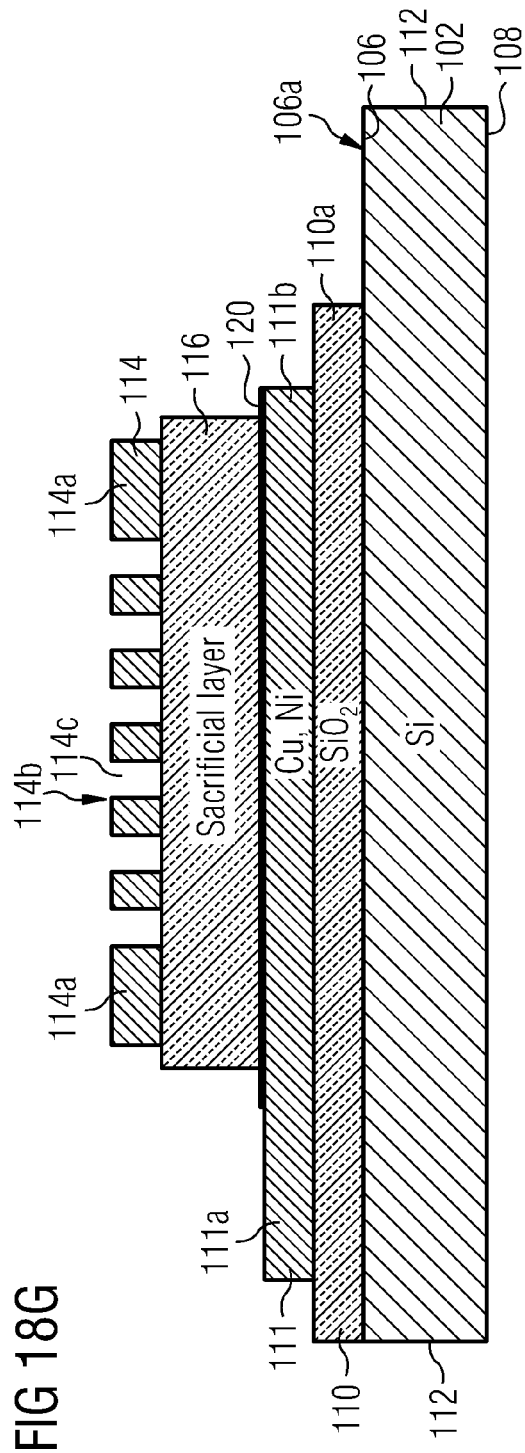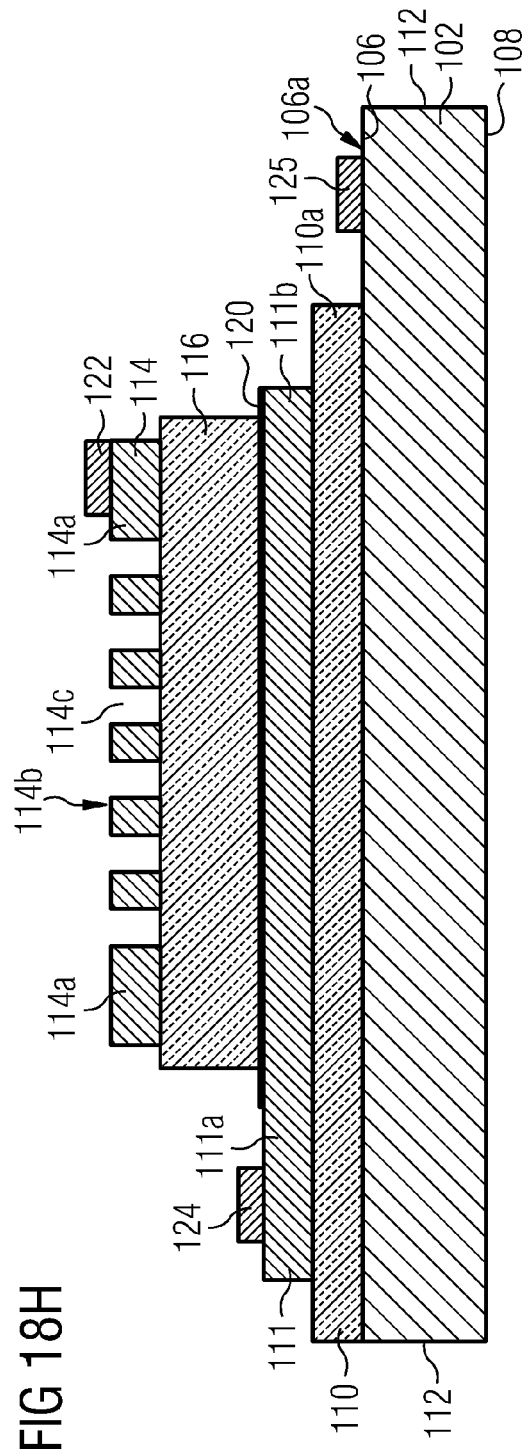

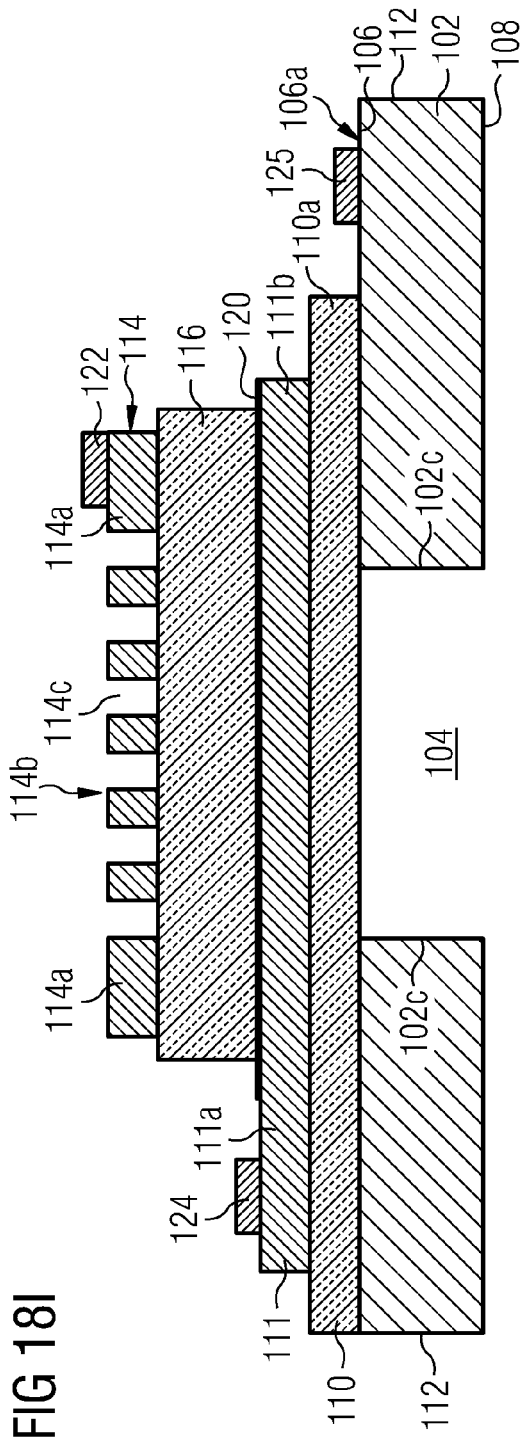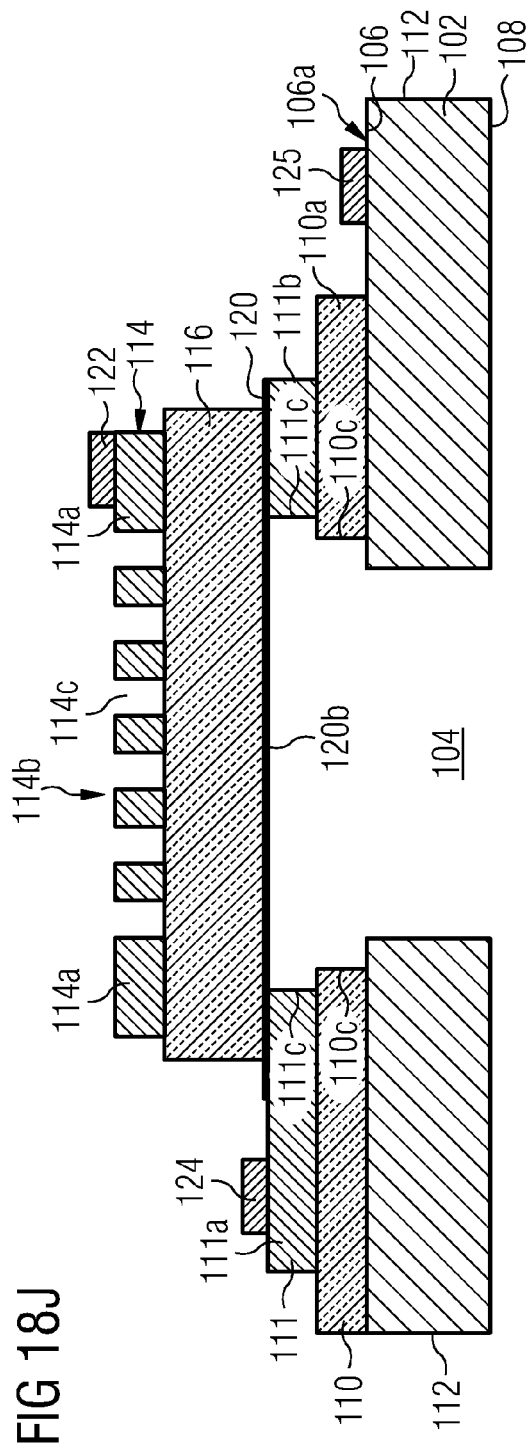

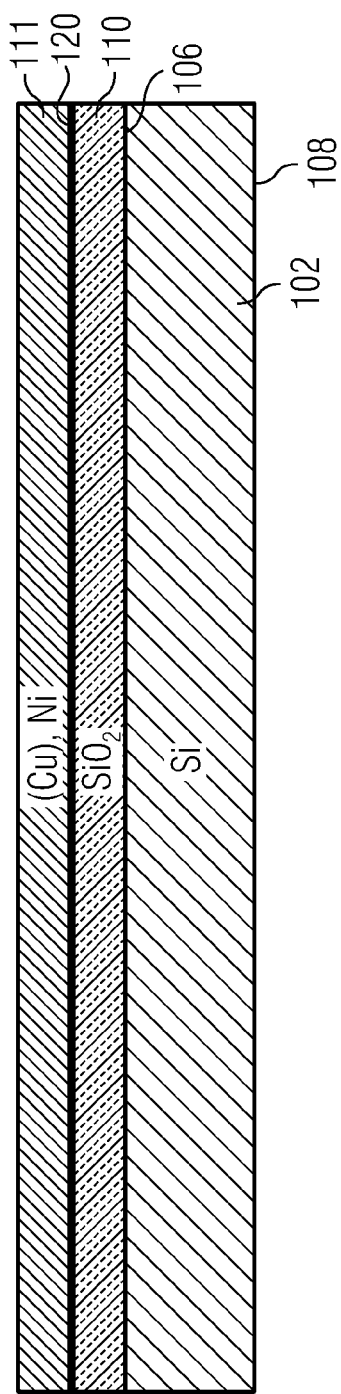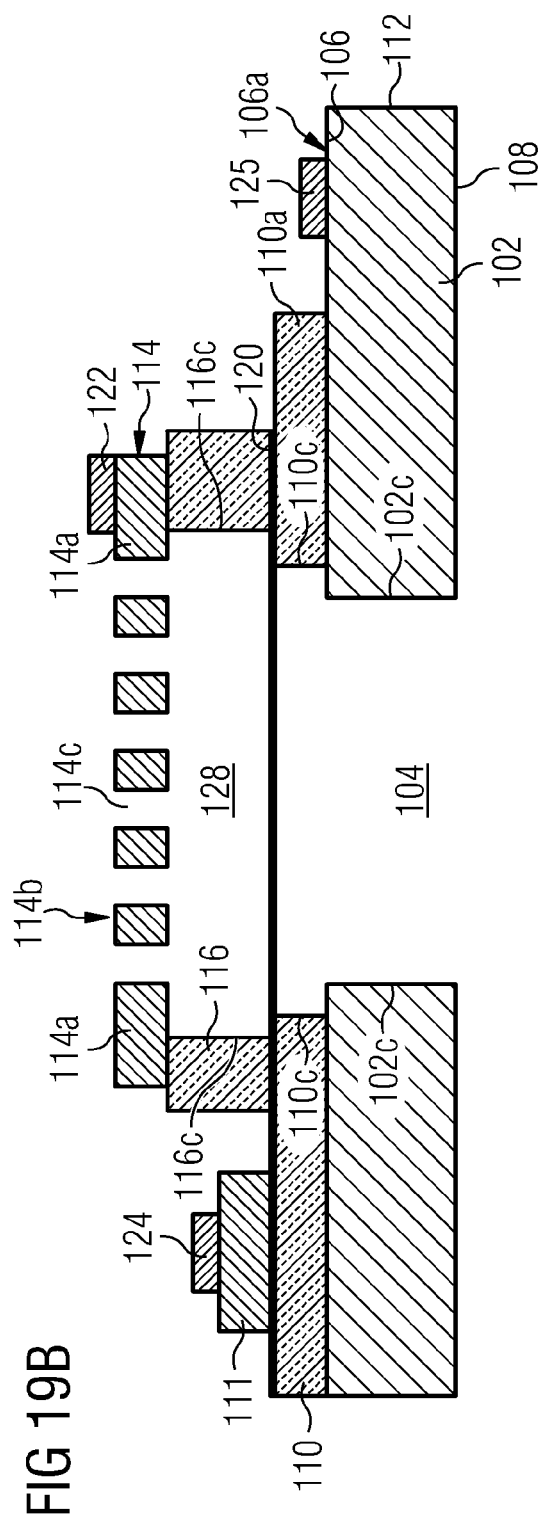

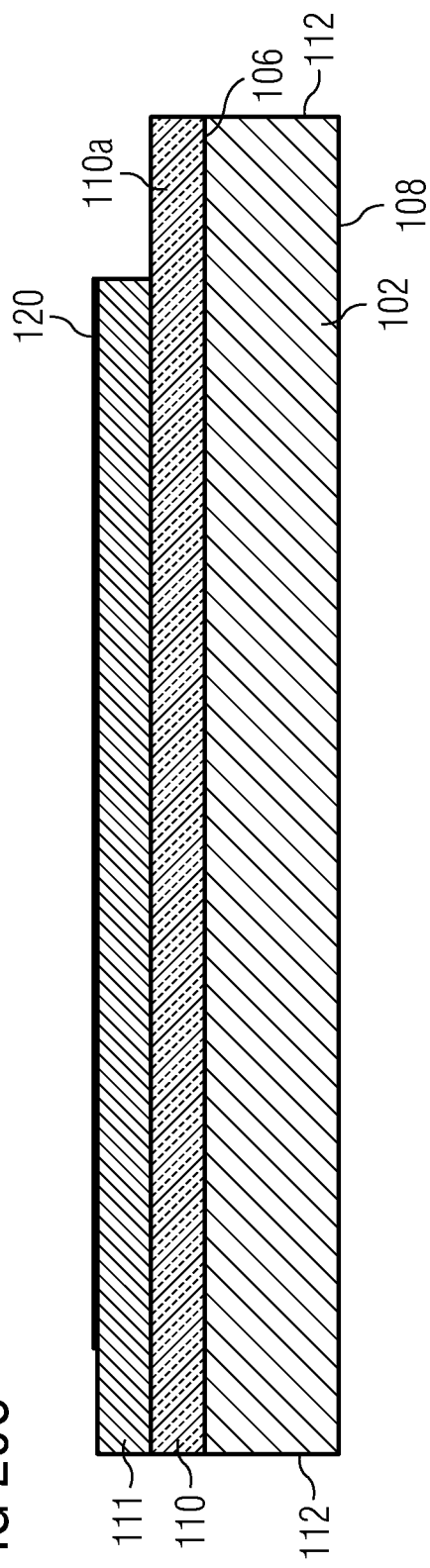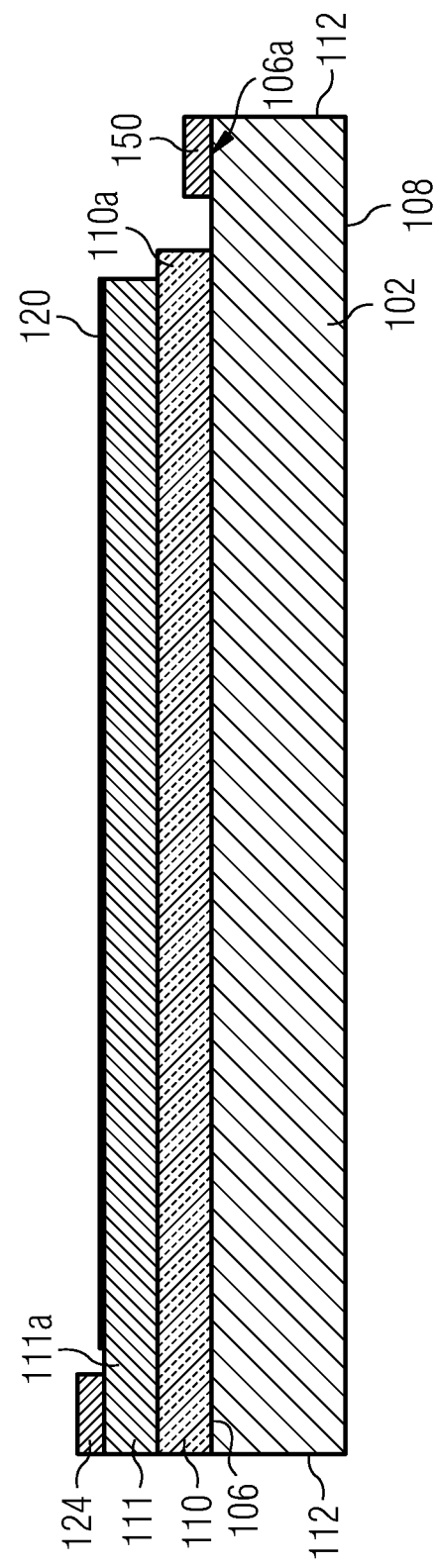

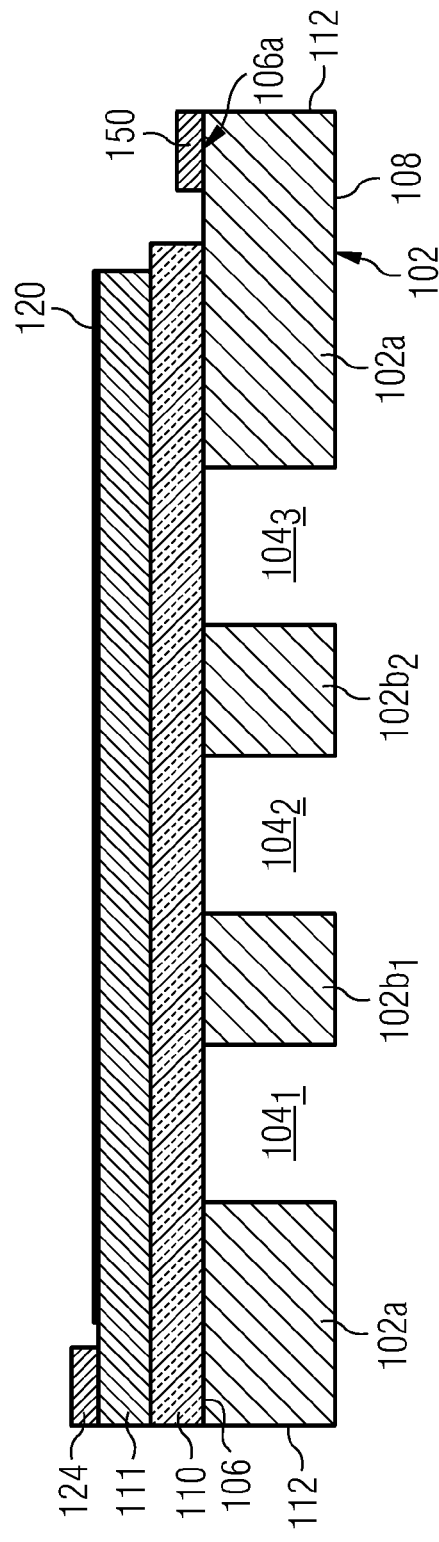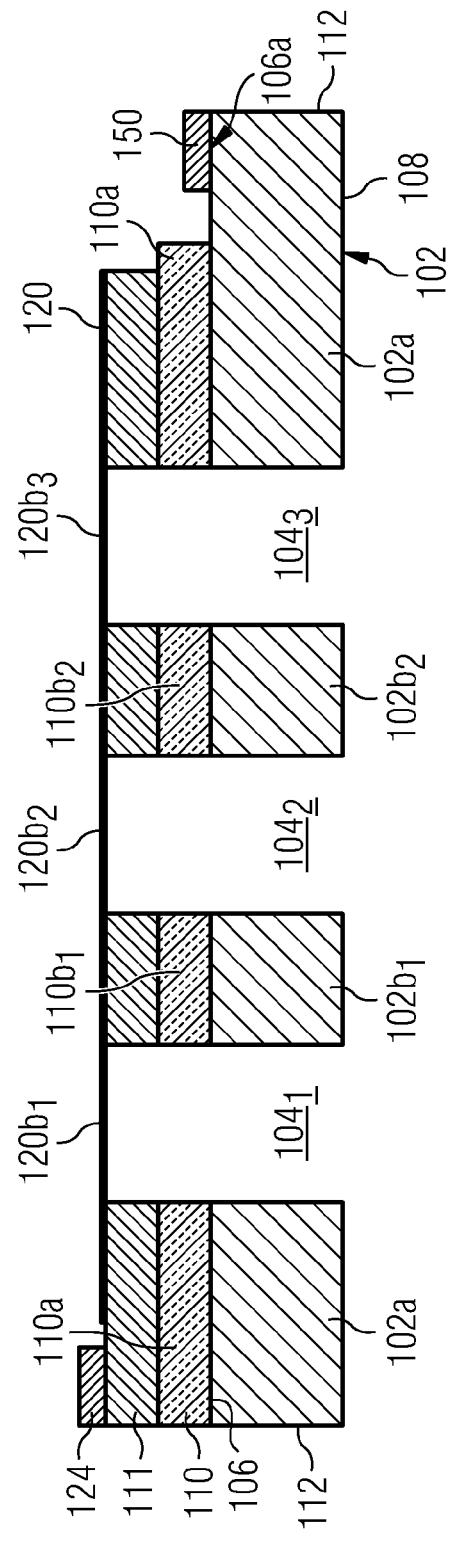

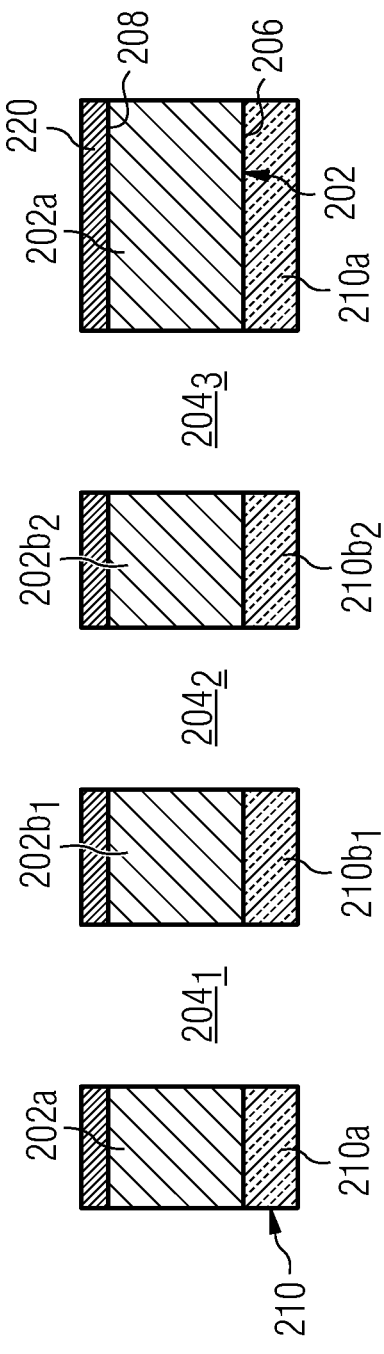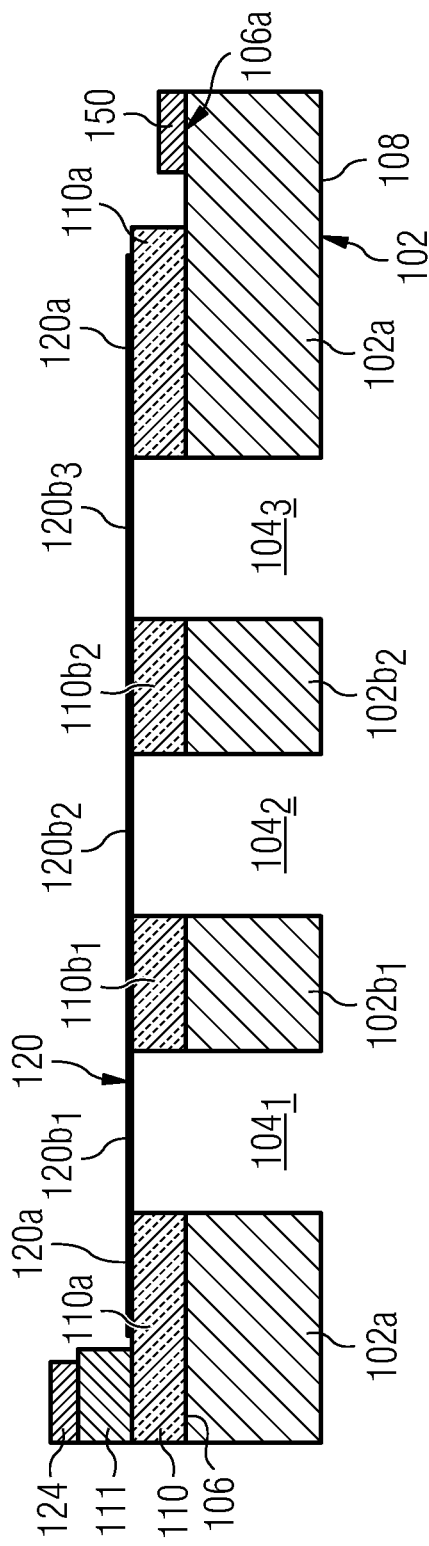

MEMS ACOUSTIC TRANSDUCER, MEMS MICROPHONE, MEMS MICROSPEAKER, ARRAY OF SPEAKERS AND METHOD FOR MANUFACTURING AN ACOUSTIC TRANSDUCER

TECHNICAL FIELD

Embodiments of the invention relate to MEMS (MEMS=Micro Electromechanical System) acoustic transducers, MEMS microphones, MEMS microspeakers, an array of speakers and a method for manufacturing an acoustic transducer, more specifically to MEMS acoustic transducers, MEMS microphones and microspeakers comprising a graphene membrane.

BACKGROUND

Microphones and microspeakers which are implemented using the MEMS technology are typically realized using silicon. MEMS microphones/microspeakers may be realized by providing a silicon substrate having a cavity covered by a silicon membrane. In MEMS microphones a small membrane displacement is sensed capacitively against a reference electrode, and in MEMS microspeakers the membrane is electrostatically actuated by electrostatic actuation between, for example, two stators for providing a large stroke displacement.

SUMMARY OF THE INVENTION

A MEMS acoustic transducer comprises a substrate having a cavity therethrough, a conductive back plate unit including a plurality of conductive perforated back plate portions which extend over the substrate cavity, a dielectric spacer arranged on the back plate unit between adjacent conductive perforated back plate portions, and one or more graphene membranes supported by the dielectric spacer and extending over the conductive perforated back plate portions.

A MEMS microspeaker comprises a conductive substrate comprising a plurality of cavities formed in a front side of the substrate, and one or more graphene membranes extending over the plurality of cavities and supported in an electrically insulated manner by the substrate and the substrate portions around the cavities.

An array of speakers comprises a substrate comprising a plurality of cavities formed in a front side of the substrate, and a plurality of microspeakers, wherein each microspeaker comprises one or more graphene membranes extending over one or more of the plurality of cavities and supported in an electrically isolated manner by the substrate and by the substrate portions around the cavities.

A method for manufacturing an acoustic transducer comprises depositing a graphene membrane on a substrate, and fabricating one or more MEMS structures.

BRIEF DESCRIPTION OF THE DRAWINGS

FIG. 3 shows another embodiment of a microphone having a graphene membrane on the bottom;

FIG. 4 shows another embodiment of a microphone having a double back plate structure including two back plates having the membrane sandwiched therebetween;

FIG. 5 shows another embodiment of a MEMS microphone including a multi-membrane microphone structure on top;

FIG. 6 shows a MEMS microphone including a multi-membrane microphone structure on the bottom;

FIG. 8 shows an example of a honeycomb structured back plate in a top view;

FIG. 9 shows an embodiment of a microspeaker including a graphene membrane;

FIG. 10, which includes FIGS. 10(a) and 10(b), shows examples of cavities having a different shape, wherein FIG. 10(a) shows cavities having a step-shaped cross section, and wherein FIG. 10(b) shows examples of the cavities having inclined cavity walls;

FIG. 14, which includes FIGS. 14(a) to 14(d), shows various options for realizing the graphene membrane, wherein FIG. 14(a) shows a single layer graphene material, FIG. 14(b) shows multiple layers of graphene material, FIG. 14(c) shows a chemically functionalized single layer graphene, and FIG. 14(d) shows a compound of pure and chemically functionalized graphene layers;

FIGS. 18(a) to 18(k) show an embodiment for manufacturing an acoustic transducer similar to the one of FIG. 3 having its graphene membrane on the bottom;

FIGS. 19(a) and 19(b) show an embodiment for manufacturing an acoustic transducer similar to the one of FIG. 18, except that the process starts with a different substrate;

FIGS. 20(a) to 20(f) show an embodiment for manufacturing an acoustic transducer similar to the one of FIG. 9;

FIG. 21 shows a second wafer or substrate for obtaining a device a shown in FIG. 11; and FIG. 22 shows an embodiment for manufacturing an acoustic transducer similar to the one of FIG. 21, except that a different substrate is used.

DETAILED DESCRIPTION OF ILLUSTRATIVE EMBODIMENTS

Figures 1, 2:
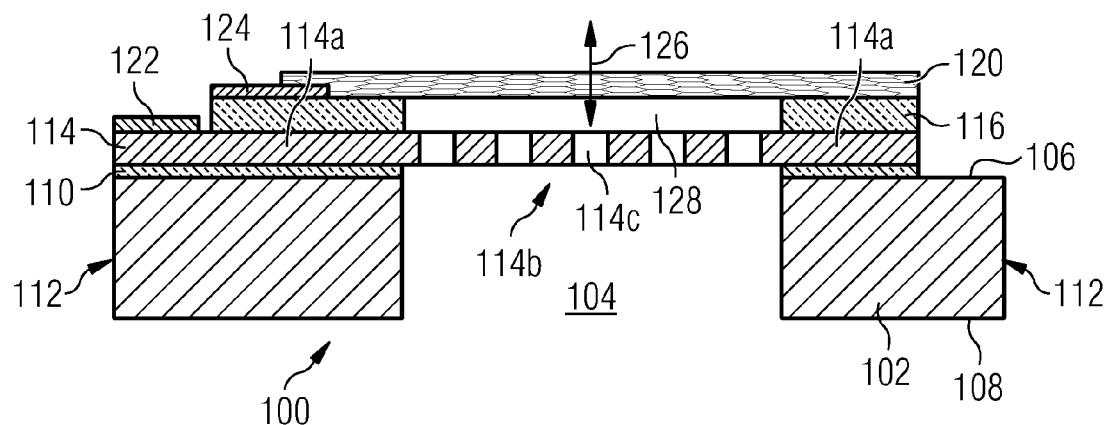
FIG. 1 shows a table indicating the mechanical properties of graphene when compared to silicon.
FIG. 2 shows an embodiment of a microphone comprising a graphene membrane on top.

In the following, embodiments of the invention will be described in further detail. Elements shown in the respective figures having the same or a similar functionality will have associated therewith the same reference signs.

Traditionally, MEMS microphones/microspeakers are manufactured in silicon technology. Silicon micromachined microphones are capacitive transducers including a flexible membrane moving in the sound field and a static perforated electrode, called back plate. In the case of excessive pressure, the membrane can be subjected to pressure differences of up to 10 bar. In such cases, typical membranes fail since their fracture strength is too low.

The reverse transducer is a microspeaker that needs to be actuated such that a large stroke displacement is achieved, for example, by a capacitive actuation, to drive a large air displacement and hence acceptable sound pressure.

To address the over pressure problem in silicon microphone membranes it is possible to insert a damping gasket in front of the microphone, however this introduces additional unwanted noise. It is further possible to increase the front volume of the microphone, however this increases the space needed in an application including the microphone. A further possibility for addressing the over pressure problem is to provide a ventilation via a spring supported membrane or by providing a venting passage, however, this requires a special design and low stress gradient of the structure. Another possibility for implementing a ventilation is by flaps in the membrane which open under pressure, however this requires an additional design area and also the stress gradient is critical.

In silicon microspeakers a large sound pressure can be generated by polysilicon membranes comprising pull-in structures, for example by providing a buckling stator speaker.

Thus, there is a need for providing an improved MEMS microphone/microspeaker.

Embodiments of the invention provide a MEMS microphone/MEMS speaker comprising, instead of a silicon membrane or a polysilicon membrane, a membrane manufactured from graphene. The mechanical properties of graphene are advantageous for generating microphone membranes of very high compliance and large fracture strength, thereby allowing a design of highly sensitive microphones being robust against any large stroke displacement. On the other hand, microspeakers can benefit from the high compliance in that the actuation voltages for obtaining the high stroke can be reduced, and at the same time the high fracture strength reduces the risk of failure and enables a high durability. In accordance with embodiments, the strength of the graphene membrane can be increased by forming a stack of two or more monolayer graphene films or layers.

Graphene as a pure carbon compound exhibits a high hydrophobicity, which is advantageous to prevent membrane sticking during the manufacturing process which may include a wet processing and also to avoid sticking in the finished device. The hydrophobicity can be modified by partly or fully chemically functionalizing the graphene, for example, by fluorination, wherein a full fluorination results in a so called flurographene having an increased hydrophobicity. Also a hydrogenation can be carried out and a full hydrogenation results in a graphene having a moderately increased hydrophilicity. Also oxidation is possible and a full oxidation results in a grapheneoxide having a strongly decreased hydrophobicity. Chemically modified single layer graphene films or composite films consisting of graphene sandwiched in between chemically modified graphene films can also be used in accordance with embodiments.

FIG. 1 shows a table indicating the mechanical properties of graphene when compared to silicon. It can be seen that the graphene outperforms silicon in terms of the values of its Young's modulus, the fracture strength, the Poisson ratio and the density. Therefore, for the reasons outlined above using graphene as a membrane material is advantageous when realizing microphones/microspeakers in MEMS technology.

FIG. 2 shows an embodiment of a microphone comprising a graphene membrane with a membrane on top. The microphone 100 comprises a substrate 102, for example, a silicon substrate, having a cavity 104 formed therein. The cavity 104 extends from a first surface 106 on the substrate 102 to a second surface 108 of the substrate which is opposite to the first surface. The first surface 106 is also referred to as front side of the substrate 102, and the second surface 108 is also referred to as backside of the substrate 102. On the front side 106 of the substrate a dielectric spacer layer 110 is arranged. The dielectric spacer layer 110 is arranged on the front side 106 of the substrate 102 so as to surround the cavity 104 and to extend from the cavity towards a periphery 112 of the substrate 102. The dielectric spacer layer 110 may extend either all the way to the periphery 112 or may be arranged such that, at specific portions of the substrate, it is recessed from the periphery 112, as shown in the right hand part of FIG. 2. The microphone 100 further comprises a conductive perforated back plate 114 comprising a peripheral region 114a and a perforated region 114b. The back plate 114 may be formed from a polysilicon, and the perforated region 114b comprises a plurality of cavities 114c extending through the back plate 114. The back plate 114 is arranged such that its perforated region 114b is arranged to extend over or across the cavity 104 of the substrate 102, and the peripheral regions 114a of the back plate 114 are arranged on the dielectric spacer layer 110. The microphone 100 comprises a further dielectric spacer layer 116 formed on the peripheral region 114a of the back plate 114. In accordance with embodiments, the dielectric spacer layer 116 does not extend into a region over the cavity 104 and at least partially covers the peripheral region 114a of the back plate 114. The microphone comprises a graphene membrane 120 that is supported by the spacer 116 above the back plate. The graphene membrane 120 is arranged above the substrate 104 in such a way that it extends over the cavity 104 and also over the conductive perforated back plate 114. The microphone comprises a first electrode 122 that is in contact with the peripheral region 114a of the back plate 114. Further, a second electrode is in contact with the graphene membrane 120. In the embodiment of FIG. 2, the second electrode 124 is arranged on the dielectric spacer in contact with the graphene membrane 120. The graphene membrane 120, as depicted by arrow 126, is deflectable in a vertical direction dependent on pressure changes. By means of the electrodes 122 and 124, which may be formed by respective metal pads, a vertical displacement of the membrane can be detected.

In addition, the MEMS structure depicted in FIG. 2 may be protected against sticking by providing anti-sticking bumps indenting from the back plane into an air gap 128 between the back plate 114 and the membrane 120 or by providing the back plate with an anti-sticking coating, like an SAMS coating or an OTS coating.

In the following, an example for manufacturing the microphone 100 depicted in FIG. 2 will be given. The process flow starts with the substrate 102 on top of which a stop oxide layer is deposited, for example, with a thickness of 500 nm. A polysilicon layer of a thickness of about 1 μm is deposited on the oxide layer together with a SiN layer having a thickness of, for example, 100 nm. This layer structure defines the back plate 114. Following the deposition of the materials for the back plate 114, a back plate structuring process is carried out for opening the cavities 114c in the perforated region 114b of the back plate 114. Following the back plate structuring, a dielectric material with a thickness of about 1 to 5 μm is deposited on the back plate and structured to form the further dielectric spacer 116 depicted in FIG. 2. Following the structuring of the spacer 116, the metal pads 122, 124 are formed. Following this, a backside cavity etch of the substrate 102 is carried out, i.e., the cavity 104 is etched from the backside 108 of the substrate towards the front side thereof such that the cavity 104 reaches the stop oxide layer provided on the front side. The stop oxide layer is removed in the area of the cavity by a further etch process. Following this, the graphene membrane 120 is provided by transferring the graphene material to the spacer 116 and to the pad 124. In accordance with embodiments, the graphene is structured on the transfer wafer and the transfer is done in alignment with the target wafer including the remaining elements of the microphone structure.

In accordance with an alternative process, the substrate 102, the back plate 114, the spacer 116 and the metal pads 122, 124 are formed as described above, however without structuring the spacer 116. Following this, the backside cavity etch is carried out for forming the cavity 104 from the backside 108 of the substrate 102 without removing the stop oxide layer from the front side. Following this, the graphene transfer process is carried out and the graphene layer is structured using conventional photolithographic processes. Following this, a sacrificial oxide etch is carried out from the backside of the substrate through the stop oxide layer and the perforation holes 114c, thereby removing the dielectric spacer 116 in the area between the perforated region 114b and the graphene membrane 120, thereby defining the air gap 128.

FIG. 3 shows another embodiment of a microphone having a graphene membrane, which other than FIG. 2 shows a microphone having the membrane on the bottom. As can be seen from FIG. 3, the structure basically corresponds to the structure of FIG. 2 except that the membrane 120 is now supported by the dielectric spacer 110 that is formed on the substrate 102, and the back plate 114, with the additional spacer 116 arranged between the back plate 114 and the membrane 120 is attached onto the membrane 120, more specifically to the peripheral portions 120a of the membrane supported by the substrate area surrounding the cavity 104. The graphene membrane 120 further has a central region 120b extending over the cavity 104. The central region 120b is further arranged opposite the perforated region 114b with the air gap 128 between the membrane 120 and the back plate 114. Thus, in FIG. 3 the membrane 120 is sandwiched between the substrate and the back plate. When providing a non-conductive substrate 102, the membrane 120 may be mounted directly to the substrate, i.e., the layer 110 may be omitted.

The microphone depicted in FIG. 3 may be manufactured by providing the substrate 102, which may be provided with a stop oxide layer defining the layer 110. However, in other cases this is not necessary, as mentioned above, and also for the processing step it is not necessary as the etching of the silicon substrate 102 will stop on the graphene layer 120. The graphene is deposited onto the substrate 102 or is transferred onto the whole wafer including a plurality of microphone structures to be manufactured followed by a graphene structuring step, unless the graphene has already been structured on the transfer layer. Following this, the spacer 116 is deposited and the back plate 114 is deposited on the spacer as described above and structured. Then the pads 122 and 124 are formed. Following this, in accordance with the first possibility, the cavity 104 is etched from the backside and a portion of the dielectric spacer 116 is removed by a sacrificial oxide etch process for forming the air gap 128. In addition, an anti-sticking coating may be applied to the back plate. Alternatively, the etch process may start with the sacrificial oxide etching for removing a part of the layer 116 for defining the air gap 128 followed by the backside etch for defining the cavity 104 which may include an additional stop oxide etch, provided that such an additional oxide layer 110 has been arranged on the substrate surface. Then, an anti-sticking coating may be applied to the back plate.

FIG. 4 shows another embodiment of a microphone 100 being a combination of the embodiments depicted in FIGS. 2 and 3 in that a double back plate structure is provided including two back plates having the membrane sandwiched therebetween. Elements which have already been described with regard to FIGS. 2 and 3 have been assigned the same reference numbers in FIG. 4 and a new description thereof is omitted. When compared to FIG. 2, the microphone 100 depicted in FIG. 4 comprises an additional dielectric spacer 130 arranged on the periphery 120a of the membrane 120. The spacer 130 supports a further back plate 132 that is similar to the back plate 114 in that it comprises a peripheral region 132a enclosing a perforated region 132b comprising a plurality of cavities or openings 132c. Arranging the back plate 132 in the above described way results in an air gap 134 between an upper surface of the graphene membrane 120 and the back plate 132 in the central region 120b of the membrane 120. The further back plate 132 is arranged and structured in such a way that the peripheral region 132a and the perforated region 132b is registered with the respective regions of the back plate 114 and such that also the openings/cavities 132c are registered with the openings 114c. In addition, the further back plate 132 is provided with a further electrode 136 on its peripheral region 132a.

The microphone 100 depicted in FIG. 4 may be manufactured by combining the process steps defined above with regard to FIGS. 2 and 3.

FIG. 5 shows another embodiment of a MEMS microphone including a multi-membrane microphone structure. When compared to the embodiments described with regard to FIGS. 2 to 4, the back plate 114 and the dielectric spacer 116 are modified. More specifically, the back plate 114 comprises a plurality of perforated regions $114b_1$, $114b_2$ and $114b_3$ with each perforated region including respective openings/cavities $114c_1$, $114c_2$ and $114c_3$. The outermost perforated regions $114b_1$ and $114b_3$ are adjacent to the peripheral region 114a of the back plate 114 and are separated from each other by intermediate regions $114d_1$ and $114d_2$ arranged between the first and second perforated regions $114b_1$ and $114b_2$ and the second and third perforated regions $114b_2$ and $114b_3$, respectively.

The dielectric layer 116 is structured such that it comprises a peripheral region 116a that is arranged on the peripheral region 114a of the back plate 114. Further, the layer 116 is structured such that a first post $116b_1$ and a second post $116b_2$ are formed, wherein the first post $116b_1$ is formed on the first intermediate region $114d_1$ of the back plate 114, and the second post $116b_2$ is formed on the second intermediate region $114d_2$.

The graphene membrane 120 is supported by the dielectric spacer 116, more specifically it is formed such that its peripheral part 120a is supported by the peripheral portion 116a of the spacer 116. The membrane 120 comprises three deflectable areas $120b_1$ to $120b_3$ extending over the cavity 104 of the substrate 102. The membrane 120 is further supported by the posts $116b_1$ and $116b_2$, thereby defining the respective deflectable membrane portions $120b_1$ to $120b_3$ being arranged opposite to the respective perforated regions $114b_1$ to $114b_3$ of the back plate 114 with respective air gaps $128_1$ to $128_3$ provided therebetween. Thus, when compared to the embodiments of FIGS. 2 to 4, in the embodiment of FIG. 5 the membrane 120 is separated into a plurality of membranes, namely the membrane portions $120b_1$ to $120b_3$ each individually suspended by means of the peripheral region 116a and/or the posts $116b_1$, $116b_2$ of the spacer 116.

The arrangement of FIG. 5 is advantageous as by providing a multi-membrane microphone, due to the fact that the compliance of the graphene material is very high, the use of multiple suspended membranes can be beneficial as it allows to obtain a high total capacitance of the overall MEMS device. The signals obtained by the small membranes $120b_1$ to $120b_3$ add up linearly so that, for example, when providing nine membranes the sensitivity is increased nine times relative to a single membrane. Further, the noise adds up as follows: $\text{sum}(\text{noise}_i^2)^{1/2}$, thereby resulting, when compared to a single membrane, a ⅓ noise (for example, −9.5 dB).

Figure 7:
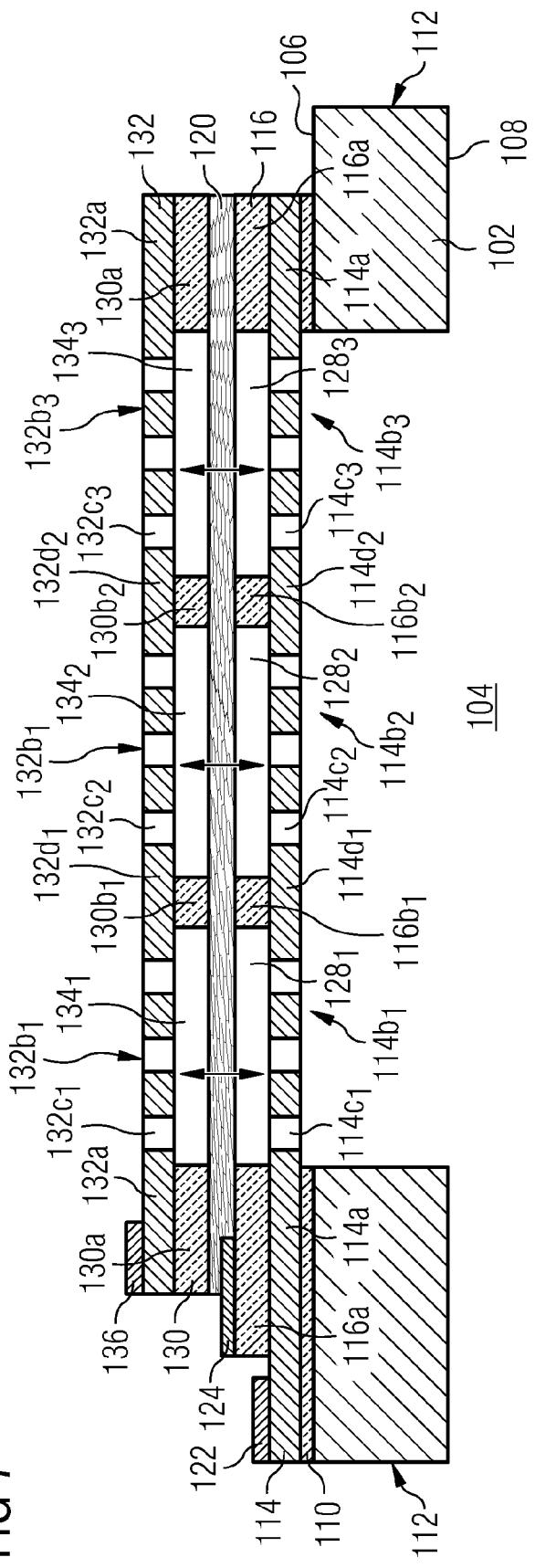
FIG. 7 shows a MEMS microphone including a multi-membrane microphone structure having a double back plate structure including two back plates having the membrane sandwiched therebetween.

The embodiment of FIG. 5 shows a multi-membrane microphone having the multi-membrane on top, like in FIG. 2, however in a similar way as described above with regard to FIG. 3 the back plate 114 may be provided on top, thereby providing a multi-membrane microphone having its membrane on the bottom, as is shown in further detail in FIG. 6. Also, an additional back plane, as is described with regard to FIG. 4, may be provided also in the embodiment of FIG. 5, thereby providing a double back plate multi-membrane microphone having the multi-membrane sandwiched between the respective back plates, as is shown in further detail in FIG. 7. When compared to FIG. 5, the microphone 100 depicted in FIG. 7 comprises the additional dielectric spacer 130 arranged with its peripheral region 130a on the periphery 120a of the membrane 120. The spacer 130 comprises the posts $130b_1$, $130b_2$ and supports the further back plate 132 that is similar to the back plate 114 in that it comprises the peripheral region 132a and the perforated regions $132b_1$ to $132b_3$ each comprising a plurality of cavities or openings $132c_1$ to $132c_3$. The back plate 132 also comprises the intermediate regions $132d_1$, $132d_2$ supporting the posts $130b_1$, $130b_2$. Arranging the back plate 132 in the above described way results in the air gaps $134_1$ to $134_3$ between an upper surface of the graphene membrane 120 and the back plate 132 in the central regions $120b_1$ to $120b_3$ of the membrane 120. The further back plate 132 is arranged and structured in such a way that its peripheral regions and its perforated regions is registered with the respective regions of the back plate 114 and such that also the openings/cavities are registered with each other. In addition, the further back plate 132 is provided with a further electrode 136 on its peripheral region 132a.

In accordance with an embodiment, a multi-membrane microphone as depicted in FIG. 5 may be comprised of subcells having a diameter of 50 μm arranged in a honeycomb structure that builds up to a MEMS having an active area with a diameter of about 1 mm.

FIG. 8 shows an example of a honeycomb structured back plate in a top view. The back plate 114 comprises a plurality of cells $138_1$ to $138_7$. Each of the cells $138_1$ to $138_7$ have the same structure and each cell comprises a perforated back plate portion/region of which in FIG. 8, as an exemplary element, the perforated region $114b_3$ of cell $138_3$ is indicated. In FIG. 8, the peripheral region 114a and the intermediate regions 114d of the back plate are not visible, as these areas in FIG. 8 are covered by the dielectric spacer 116. In FIG. 8, the peripheral area 116a of the dielectric spacer is shown as well as the posts $116b_1$ and $116b_2$ which are arranged between the respective perforated regions 114b.

In the embodiment shown in FIG. 8, each of the cells has a diameter of about 50 μm. Each of the cells has an hexagonal shape, and the back plate in the perforated regions is structured in such a way that each cell includes an outer frame 140 of hexagonal shape and an inner frame 142, the two frames being arranged concentrically with respect to each other. The two frames 140, 142 are connected by respective bars 144 connected to each other in a central region 146 of the cell and extending from the center 146 to the respective corners of the outer frame 140 while extending also over the corners of the inner frame 142. By means of this arrangement respective openings/cavities 114c are formed in the areas between the outer frame 140 and the inner frame 142 and the bars 144 and between the inner frame 142 and the center 146 and the bars 144. In the embodiment depicted in FIG. 8, the outer frame has a horizontal thickness that is greater than the horizontal thickness of the inner frame 142, and the bars 144 are tapered such that their horizontal thickness decreases in a direction from the corners of the outer frame 140 towards the center 146.

In the embodiment shown in FIG. 8, a back plate unit having a honeycomb structure having a plurality of hexagonal cells has been described. However, it is noted that the invention may be implemented in a different way. The back plate unit may comprises cells of an arbitrary shape, e.g., the cells of the conductive back plate unit may comprise a rounded perimeter or a curved shape (e.g., a circular shape), or a polygonal shape (e.g., a square shape or a trigonal shape).

The above description of FIGS. 2 to 8 referred to a microphone 100, however the same structure may be realized as a microspeaker. When realizing a microspeaker, a signal generator is connected between the respective electrodes 122, 124 and 136 for applying an actuating signal for deflecting the membrane 120 in a desired way.

FIG. 9 shows an embodiment of a microspeaker including a graphene membrane. Elements that have already been described with regard to the preceding figures have associated therewith the same reference numbers and an additional description thereof is omitted.

As can be seen from FIG. 9, the substrate 102, other than the other embodiments, comprises a plurality of cavities/openings $104_1$ to $104_3$ extending from the front side 406 of the substrate 102 to the backside 108 of the substrate 102. The substrate 102 comprises a peripheral region 102a and respective intermediate regions $102b_1$ to $102b_2$. The cavities $104_1$ to $104_3$ are separated from each other by the intermediate regions $102b_1$ and $102b_2$. More specifically, the first cavity $104_1$ is arranged between the peripheral region 102a and the first intermediate region $102b_1$, and the third cavity $104_3$ is arranged between the peripheral region 102a and the second intermediate region $102b_2$. The second cavity $104_2$ is arranged between the two intermediate regions $102b_1$ and $102b_2$. On the front side 106 of the substrate 102 the dielectric spacer layer 110 is provided which is structured to comprise a peripheral region 110a arranged on the peripheral region 102a of the substrate 102. Further, the dielectric spacer layer 110 comprises a plurality of posts $110b_1$ and $110b_2$ arranged on the intermediate regions $102b_1$, $102b_2$ of the substrate 102. The membrane 120 formed of graphene material is supported by the dielectric spacer layer 110, more specifically it is supported by its peripheral region 110a and by the respective posts $110b_1$ and $110b_2$. By this arrangement, the membrane 120 comprises a peripheral, fixed region 120a and three deflectable regions $120b_1$ to $120b_3$ which can be deflected vertically as is shown by arrows $126_3$ resulting in a deformation of the movable portions as is indicated at $120b_1'$ to $120b_3'$. In FIG. 8, as an example the lateral dimension of the respective cavities $104_1$ to $104_3$ is 200 µm and also the electrical field lines are depicted when the membrane portions are deflected.

In FIG. 9, the substrate 120 is a conductive substrate and in a peripheral region thereof an electrode 150 is arranged. Further, as in the embodiments described earlier, the membrane has attached thereto the electrode 124. Between the two electrodes 124 and 128 a signal generator 152 comprising an AC signal source 152a and a DC signal source 152b is connected for actuating the membrane for causing a deflection as depicted in FIG. 9.

Due to the high compliance of the graphene membrane 120, in accordance with the embodiment of FIG. 9, the membrane can be actuated against the cavity of the substrate itself without the need of providing a structured and perforated back plate. While FIG. 9 shows three cavities in a row, it is noted that the structure may comprise a plurality of cavities, e.g., arranged in an array.

In FIG. 9, the cavities $104_1$ to $104_3$ are shown as "vertical" cavities, i.e., the cavity walls extend perpendicular to the front and backsides of the substrate. However, other shapes of the cavities are possible. FIG. 10 shows examples of cavities having a different shape. In FIG. 10(a) the cavities $104_1$ to $104_3$ have a step-shaped cross section with a larger diameter at the front side 106 of the substrate 102 and a smaller diameter at the backside 108. For example, the larger diameter portion of the cavity may be 200 µm as shown in FIG. 9, however the smaller diameter portion has a diameter of only 50 µm. This structure allows increasing the field strength. The structure shown in FIG. 10(a) can be obtained by a process using a front side designed cavity by an oxide spacer or by combined front side and backside trench etching and a subsequent graphene deposition.

FIG. 10(b) shows examples of the cavities having inclined cavity walls, wherein the cavities are formed such that the cavity diameter decreases in a direction from the front surface 106 towards the back surface 108. The trenches $104_1$ to $104_3$ having the inclined trench walls may be obtained by anisotropically etching the cavity, for example by using KOH or TMAH.

Figure 11:
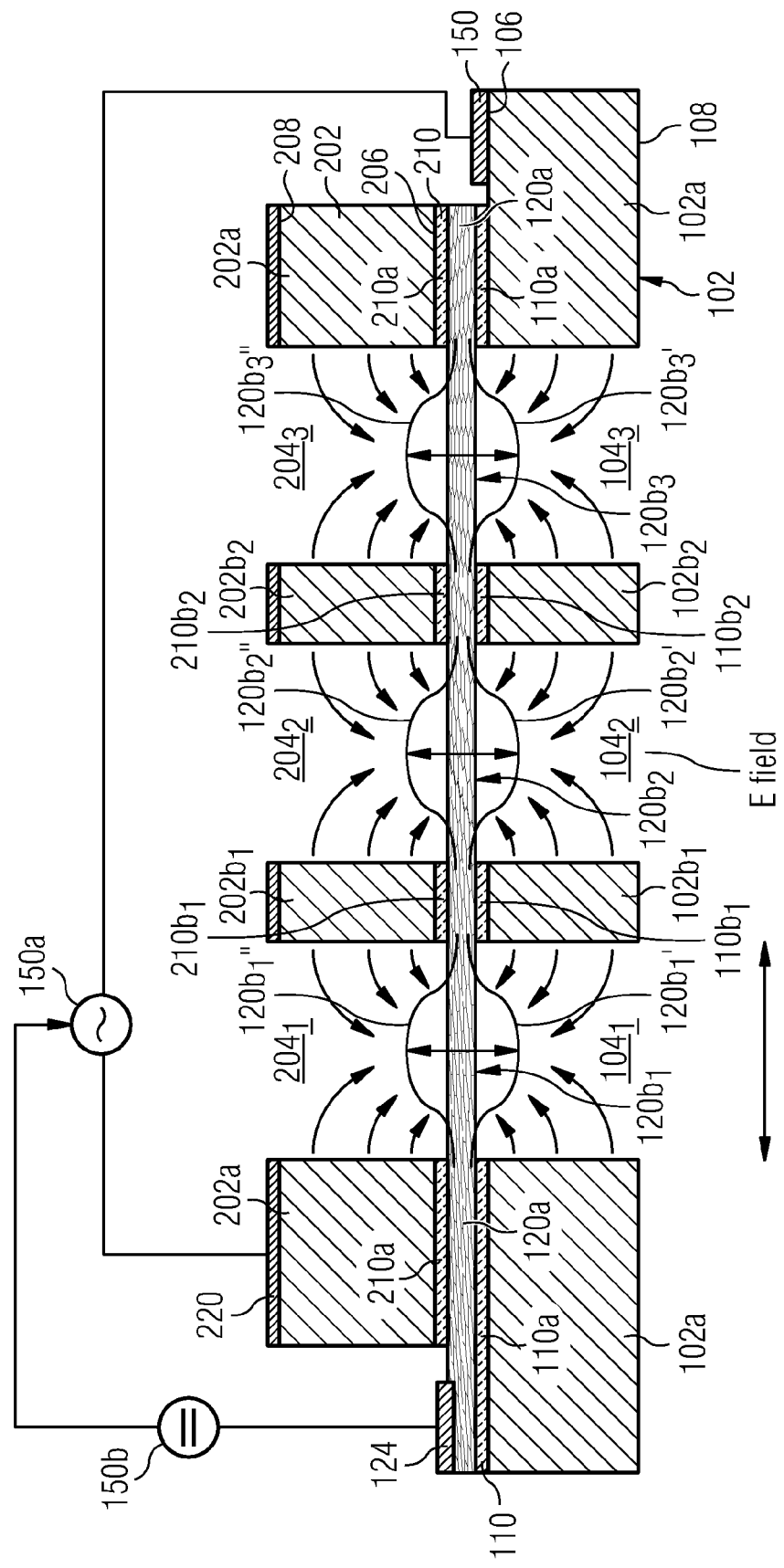
FIG. 11 shows another embodiment of a microspeaker including a graphene membrane allowing for a symmetric driving of the membrane.

FIG. 11 shows another embodiment of a microspeaker including a graphene membrane allowing for a symmetric driving of the membrane. Starting from the microspeaker described with regard to FIG. 9, the microspeaker of FIG. 11 comprises an additional substrate or plate 202 including a plurality of cavities $204_1$ to $204_3$ extending through the substrate 202 from its front side 206 to its backside 208. Like the first substrate 102, also the second substrate 202 comprises a peripheral region 202a and intermediate regions $202b_1$ and $202b_2$ separating the respective cavities. As can be seen from FIG. 11, the peripheral region 202a of the second substrate 202 is recessed with regard to the peripheral regions 102a of the first substrate 102 for exposing the electrodes 124 and 150. The substrate 202 is arranged such that the cavities $204_1$ to $204_3$ and the intermediate portions $202b_1$ to $202b_2$ are registered with the corresponding openings and intermediate portions of the substrate 102. The further substrate 102 is arranged on the graphene membrane 120 with an additional dielectric spacer layer 210 arranged between the membrane 120 and the substrate 202. More specifically, the further dielectric spacer layer 210 comprises a peripheral region 210a sandwiched between the peripheral region of the membrane 120a and the peripheral region 202a of the further substrate 202. Further, the dielectric layer 210 comprises posts $210b_1$ and $210b_2$ on the respective intermediate portions $202b_1$ and $202b_2$ of the substrate 202. The substrate 202 comprises a further electrode 220 on its backside 206. Between the electrodes 150 and 220 the AC signal generator 150a is connected, and the DC signal generator 150b is connected between the electrodes 124 and the AC signal generator 150a.

The arrangement of FIG. 11 allows for a symmetric deflection of the graphene membrane upwards and downwards, as is depicted by the deflected portions $120b_1'$ to $120b_3'$ and $120b_1''$ to $120b_3''$.

In accordance with embodiments, a plurality of microspeakers may be formed on a substrate in a way as described above to form an array of speakers with independent driven membranes to be used, for example, in digital sound reconstruction arrangements.

Figure 12:
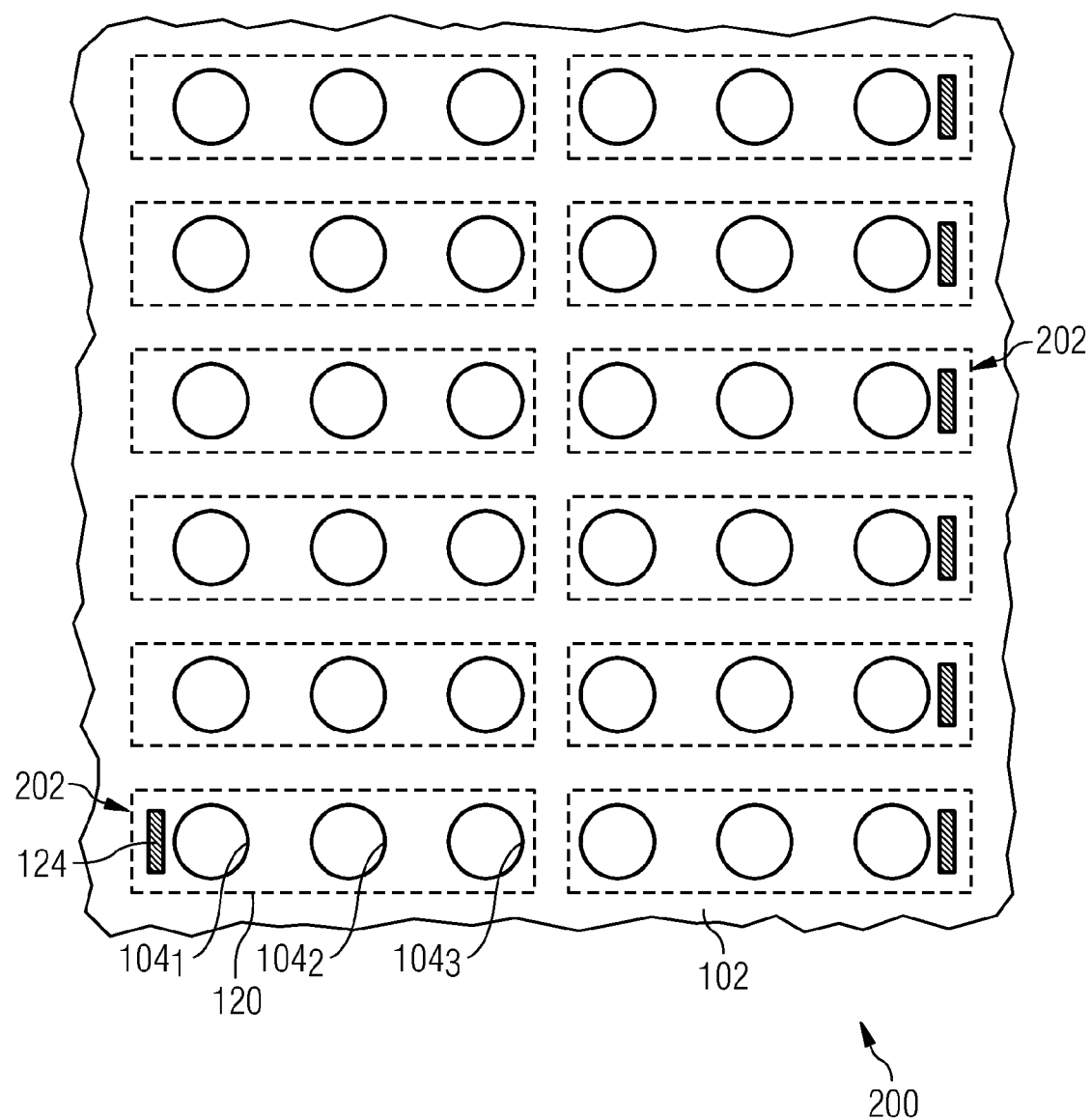
FIG. 12 shows a schematic representation of an array of speakers in accordance with an embodiment.

FIG. 12 shows a schematic representation of an array of speakers in accordance with an embodiment. The array 200 comprises the substrate 102 comprising a plurality of cavities formed in a front side of the substrate 102 (see, e.g., the cavities $104_1$ to $104_3$ also described above). For defining the respective microspeakers 202 of the array, a plurality of graphene membranes 120 are provides to extend over one or more of the plurality of cavities 104 in a way as described above. Each membrane 120 has its electrode 124 so that the graphene membranes 120 of the respective microspeakers 202 can be independently driven.

It is noted that, while FIG. 12 explicitly refers to an array of microspeakers, in accordance with embodiments, also a plurality of microphones may be formed on a substrate in a way as described above to form an array of microphones with independent membranes.

Figure 13A:
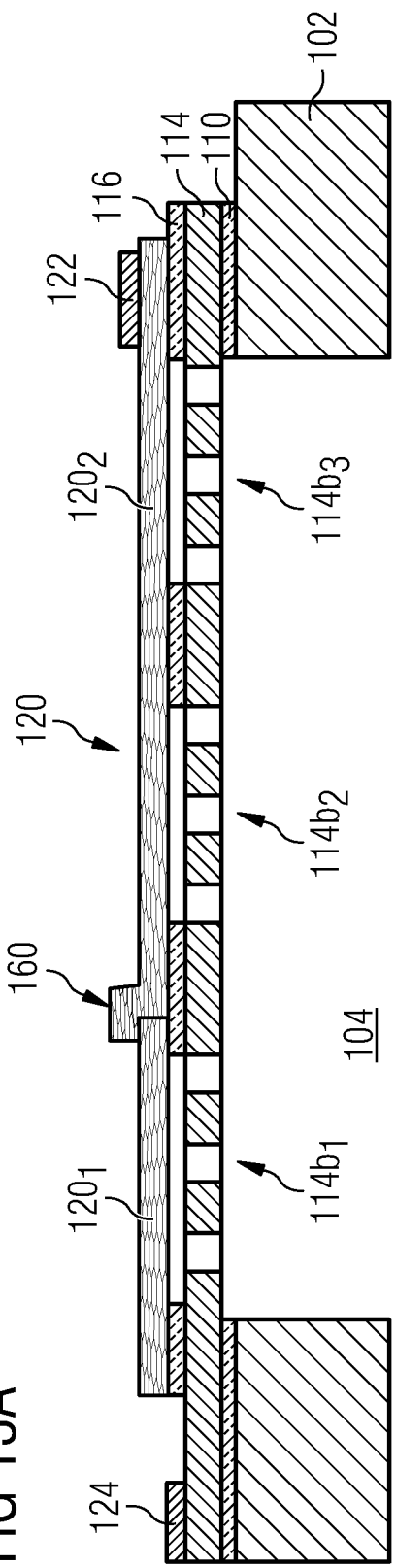
FIG. 13(a) shows an example for a "multipart" membrane in an embodiment as described with regard to FIG. 2.

In the above described embodiments, the graphene membrane 120 has been described and depicted as a single membrane extending between the peripheral regions of the substrate, however, it is noted that other embodiments may be realized using two or more graphene membranes. FIG. 13(a) shows an example for providing a "multipart" membrane in an embodiment as described with regard to FIG. 2. As can be seen, the membrane 120, that is schematically shown, is formed by a first membrane $120_1$ extending over a first perforated back plate region $114b_1$, and it comprises a second membrane $120_2$ extending over the second and third perforated back plate portions $114b_2$ and $114b_3$. The two membranes $120_1$ and $120_2$ are connected to each other, as is shown at 160.

Figure 13B:
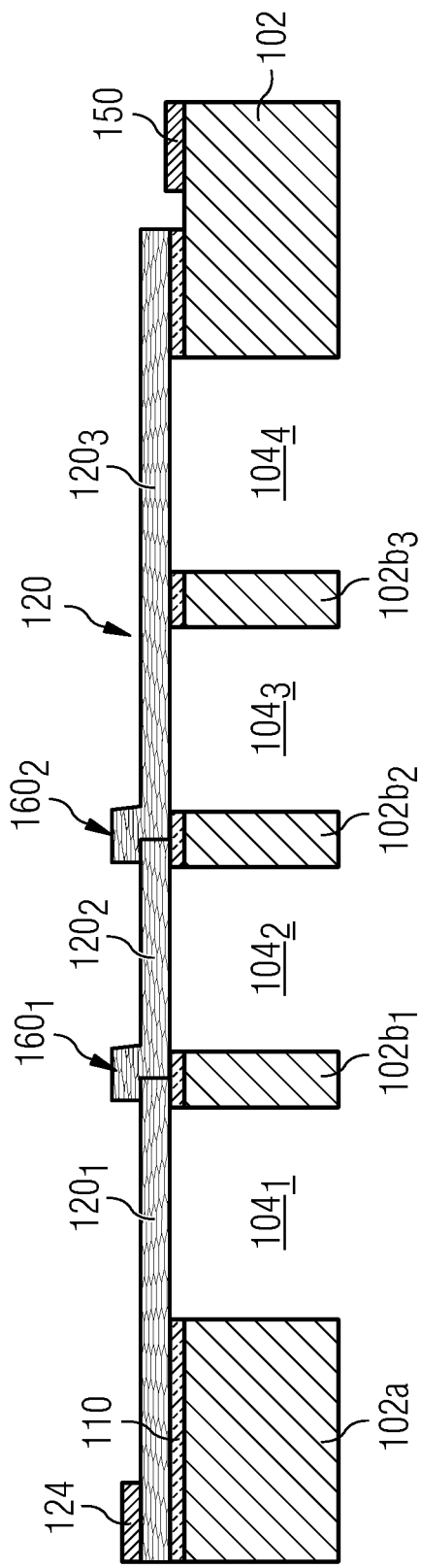
FIG. 13(b) shows an example for a "multipart" membrane in an embodiment as described with regard to FIG. 9.
Figure 14A:
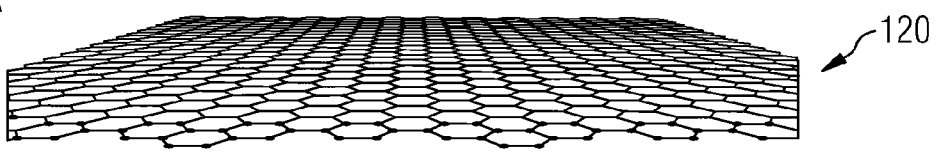
Figure 14B:
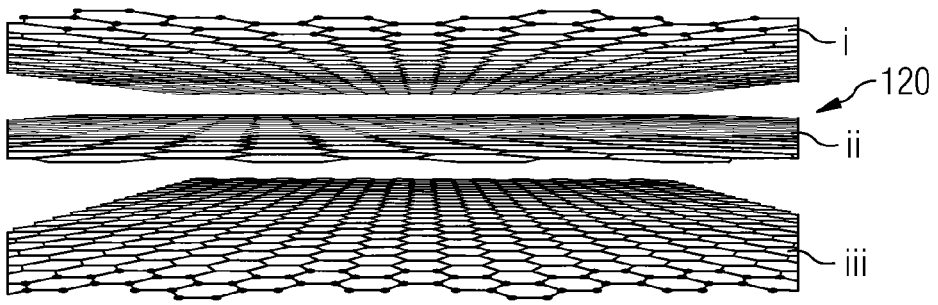
Figure 14C:
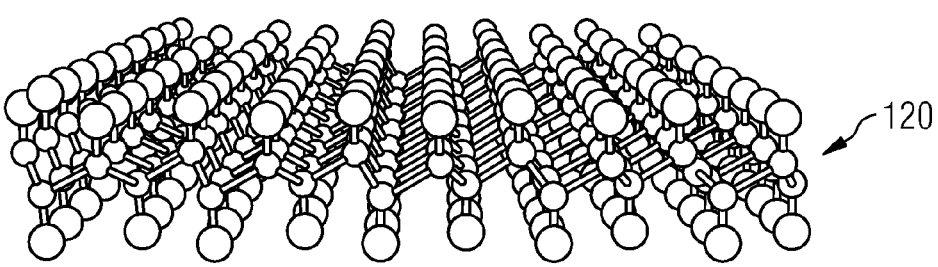
Figure 14D:
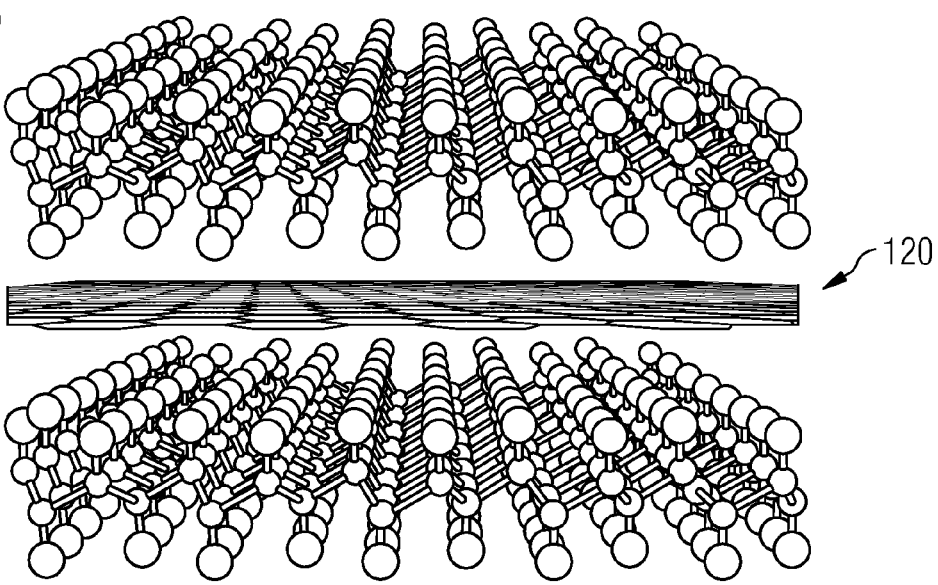

FIG. 13(b) shows an example of the microspeaker similar to the one of FIG. 9, where instead of a single graphene membrane, three membranes $120_1$ to $120_3$ are provided. The first membrane $120_1$ extends from the peripheral region 102a of the substrate 102 over the first cavity $104_1$ to the first intermediate region $102b_1$. A second membrane $120_2$ is extending over the second cavity $104_2$ and a third membrane $120_3$ extends over the third and fourth cavities $104_3$ and $104_4$. The membranes are connected with each other as is depicted at $160_1$ and $160_2$.

FIG. 14 shows various options for realizing the graphene membrane 120 described above with regard to the preferred embodiments. FIG. 14(a) shows the graphene membrane 120 which comprises a single layer graphene material. FIG. 14(b) shows the graphene membrane 120 comprising multiple layers of graphene material, in FIG. 14(b) three layers i, ii and iii. FIG. 14(c) shows a graphene membrane 120 comprising a chemically functionalized single layer graphene, for example a fluorographene. FIG. 14(d) shows a graphene membrane 120 being a compound of pure and chemically functionalized graphene layers, for example, a combination of a single layer graphene depicted in FIG. 14(a) sandwiched between two chemically functionalized single layer graphene as depicted in FIG. 143(c).

Figure 15:
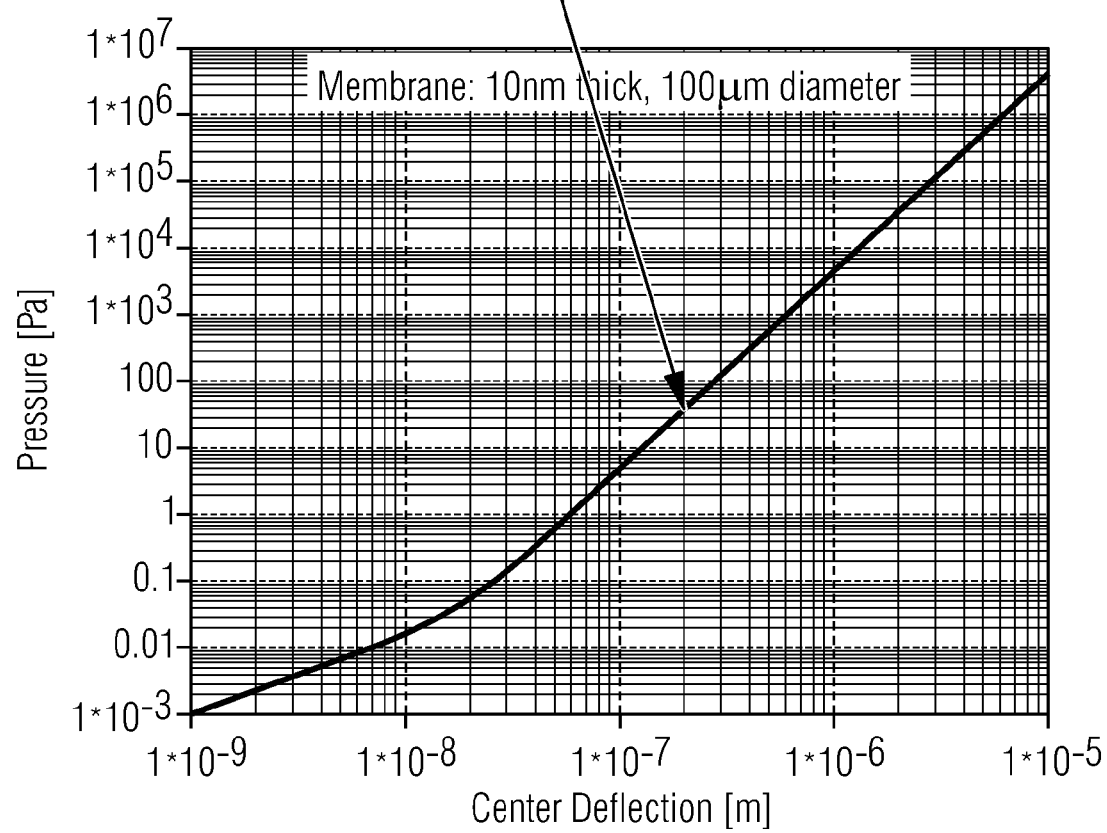
FIG. 15 shows a table indicating for the graphene membrane the membrane compliance versus the membrane thickness.

FIG. 15 shows a table indicating for the graphene membrane the membrane compliance versus the membrane thickness. As can be seen, using graphene membranes is advantageous as despite the small thickness of the membranes, a high compliance is achieved thereby avoiding problems as discussed above in conventional silicon membranes.

Figure 16:
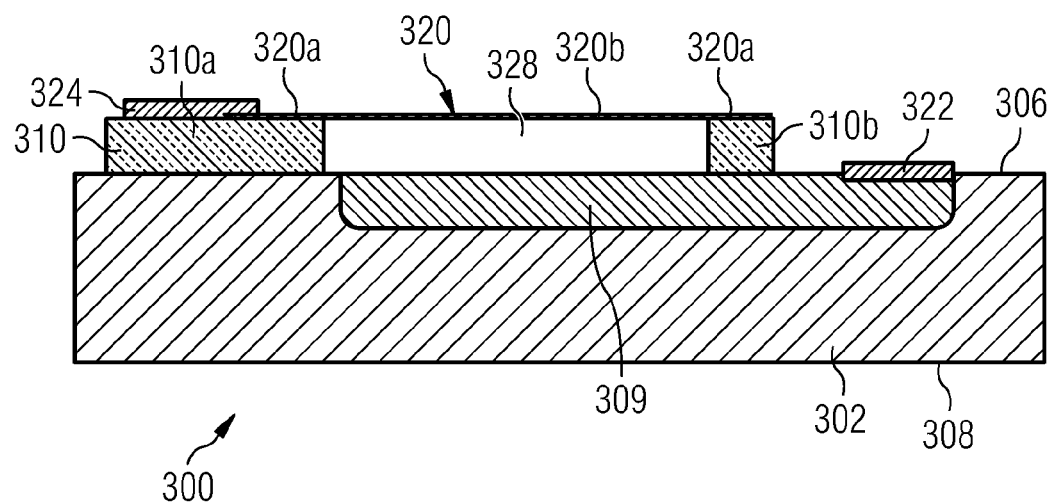
FIG. 16 shows a surface micromachined pressure sensor in accordance with embodiments of the invention using as pressure sensitive element a graphene membrane and a well electrode.
Figure 17:
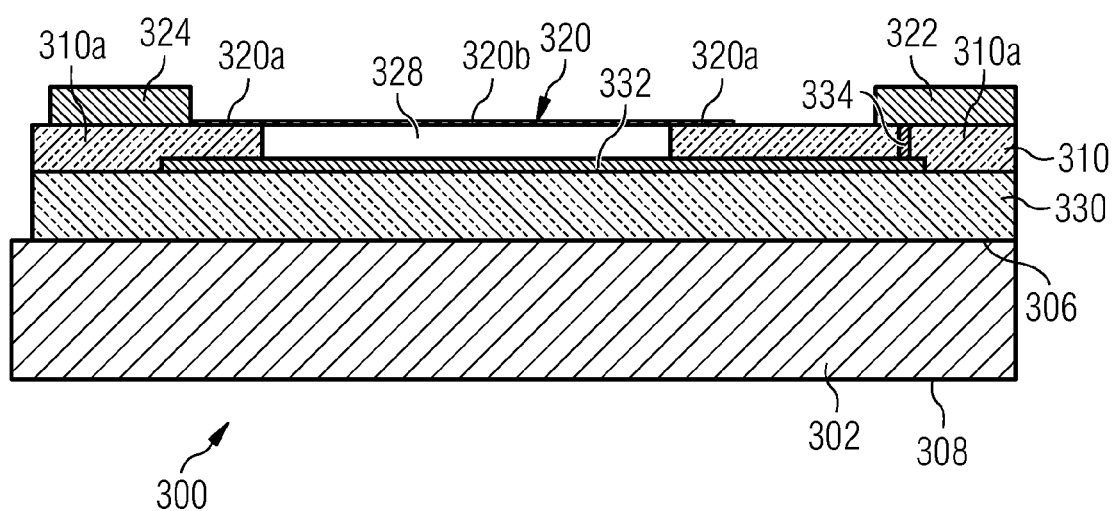
FIG. 17 shows a surface micromachined pressure sensor in accordance with embodiments of the invention using as pressure sensitive element a graphene membrane and integrated into in a metal stack BEOL.

FIG. 16 and FIG. 17 show a surface micromachined pressure sensor in accordance with embodiments of the invention using as pressure sensitive element a graphene membrane, either with a well electrode (FIG. 16) or integrated into in a metal stack BEOL (no semiconductor effect).

FIG. 16 shows an embodiment of a pressure transducer 300 with a well electrode. The pressure transducer 300 comprises a substrate 302, for example a silicon substrate, having a first surface 306 (front side) and a second surface 308 (backside) which is opposite to the first surface. In the front side 308 a well electrode 309 is formed, e.g., by introducing dopants for obtaining a desired conductivity in the well. On the front side 306 of the substrate 302 a dielectric spacer layer 310 is arranged. The dielectric spacer layer 310 comprises a first or peripheral portion 310a arranged on the front side 106 of the substrate 102 outside of the well electrode 309, and a second portion 310b laterally spaced apart from the first portion 310a and arranged on the well electrode 309. Alternatively, the second portion of the dielectric spacer layer 310 may also be arranged outside the electrode 309. The sensor comprises a graphene membrane 320 that is supported with its peripheral region 320a by the respective portions 310a, 310b of the spacer 310 above the substrate 302 such that its central, deflectable portion 320b is arranged opposite the well electrode 309 with a gap 328 therebetween. The sensor comprises a first electrode 322 that is in contact with the well electrode 309, and a second electrode 324 in contact with the graphene membrane 320. By means of the electrodes 322 and 324, which may be formed by respective metal pads or lines, a vertical displacement of the membrane 320 due to a pressure applied can be detected.

FIG. 17 shows an embodiment of a pressure transducer 300 integrated into in a metal stack BEOL (no semiconductor effect). Similar to the sensor of FIG. 16, also the pressure transducer 300 of FIG. 17 comprises the substrate 302. Other that in FIG. 16, in FIG. 17 on the front side of the substrate 302 a dielectric layer 330 is formed. On the surface of the layer 330 which faces away from the substrate 302 an electrode 332, e.g., a metal electrode, is formed. On the layer 330 the dielectric spacer layer 310 is arranged. In FIG. 17, the dielectric spacer layer 310 comprises a cavity (defining the gap 328) and the first or peripheral portion 310a is arranged on the layer 330 and covers in part the electrode 332. The graphene membrane 320 is supported with its peripheral region 320a by the peripheral portion 310a of the spacer 310 above the electrode 332 such that its central, deflectable portion 320b is arranged opposite the exposed area of the electrode 332 with the gap 328 therebetween. The sensor comprises a first electrode 322 formed on the layer 310 and in contact with the electrode 332 by a via 334, and a second electrode 324 in contact with the graphene membrane 320. By means of the electrodes 322 and 324, which may be formed by respective metal pads or lines, a vertical displacement of the membrane 320 due to a pressure applied can be detected.

In the following embodiments of the invention for manufacturing an acoustic transducer will be described.

In conventional processes used so far, the graphene is deposited on a wafer with a different seed layer (e.g., a metal). The MEMS device is fabricated using a separate wafer. At a certain point in the process the graphene layer will be transferred to the MEMS wafer. Such conventional approaches are disadvantageous as it is necessary to provide an additional wafer or substrate for depositing and structuring the graphene layer. The mechanical parameters of the graphene may not be well defined after transfer to the MEMS wafer, e.g., due to transfer problems that may introduce stress into the layer. Further, the electrical contact to the graphene layer needs to be defined properly.

In accordance with embodiments such drawbacks and problems are avoided. In accordance with embodiments of the invention an acoustic transducer is manufactured by depositing the graphene material on a substrate and by fabricating one or more MEMS structures using the substrate already having the graphene material provided thereon. With other word, the wafer or substrate on which the graphene is deposited is the MEMS wafer or substrate. This approach is advantageous as no additional wafer or substrate is required, the graphene mechanical parameters are well defined by the deposition, any transfer problems are avoided, and the electrical contact to graphene layer is already perfect.

In accordance with one embodiment the graphene layer may be deposited on a metal surface, e.g., a metal layer, formed on the substrate. This can performed either by catalytic decomposition of a carbon source, e.g., a hydrocarbon compound, or segregation of carbon dissolved in the metal layer bulk to the metal surface. In accordance with another embodiment the graphene layer may be deposited at a metal-dielectric interface formed by a metal layer and a dielectric layer on the substrate. This can be performed by catalytic decomposition of a carbon source, e.g., a hydrocarbon compound, diffused through the metal film to the interface between the metal layer and the dielectric layer or segregation of carbon dissolved in the metal layer bulk to the interface between the metal layer and the dielectric layer. Following the deposition of the graphene layer, in both embodiments, the additional MEMS components are formed.

In the following an embodiment for manufacturing an acoustic transducer similar to the one of FIG. 3 having its graphene membrane on the bottom will be described with reference to FIG. 18. The same reference signs as in FIG. 3 will be used.

Figure 18A:
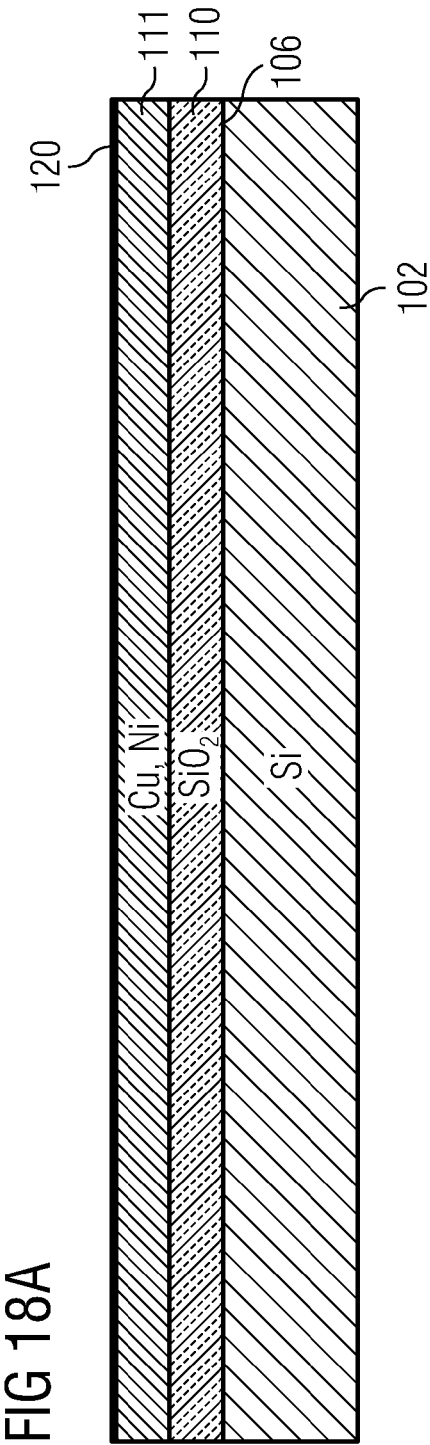

FIG. 18(a) shows the substrate 102. On the front side 106 of the substrate 102 the insulating layer 110, e.g., a $SiO_2$ layer, is formed. On the surface of the insulating layer 110 facing away from the substrate 102 a metal layer 111, e.g., a Cu layer or a Ni layer, is formed. On the surface of the metal layer 111 facing away from the insulating layer 110 the graphene material 120 is deposited.

Figure 18B:
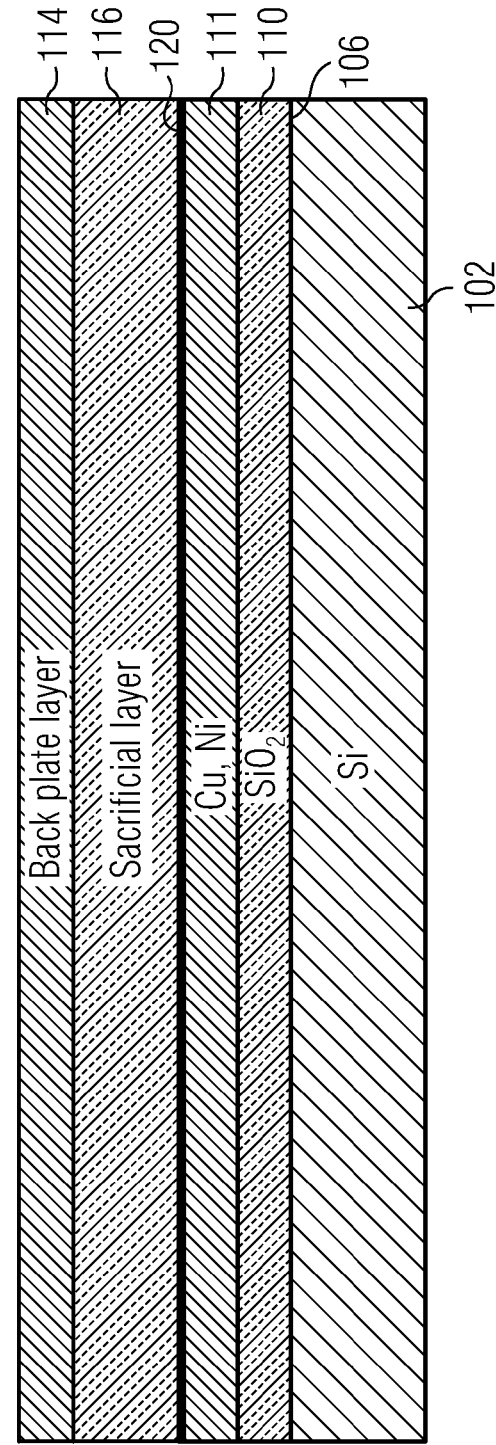

Following the deposition of the graphene material 120, the dielectric spacer or sacrificial layer 116 is formed on the graphene layer 120, and a conductive layer 114 is formed on the sacrificial layer 116, as is shown in FIG. 18(b).

The conductive layer 114 is then patterned to form the peripheral region 114a, the perforated region 114b, and the plurality of cavities 114c extending through the layer 114.

Figure 18C:
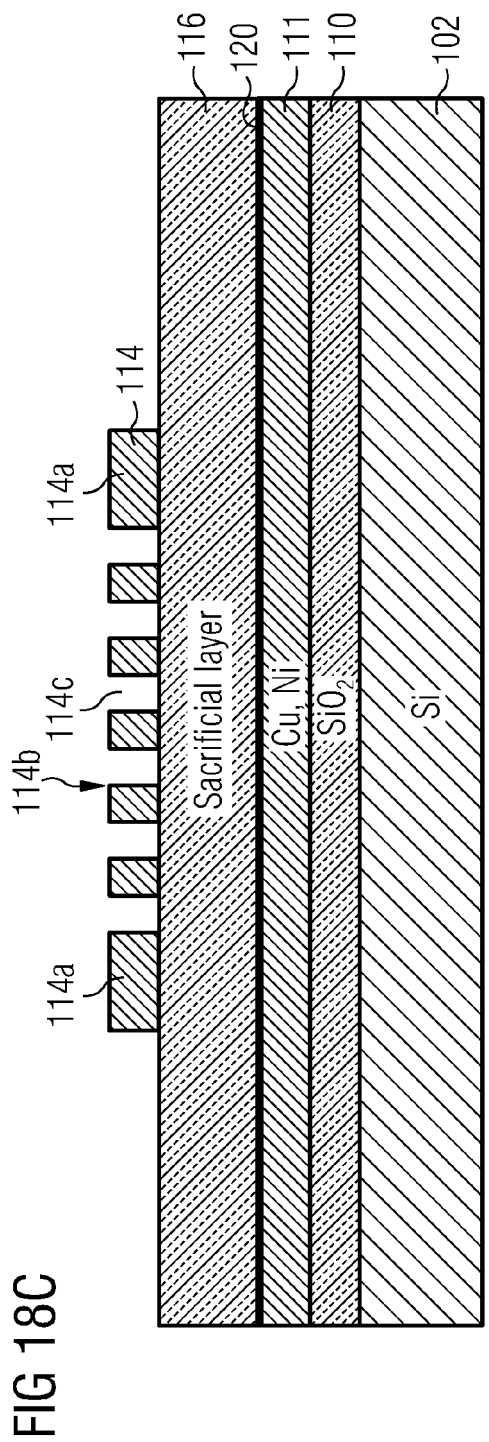

The resulting structure including the conductive perforated back plate 114 is shown in FIG. 18(c).

Figure 18D:
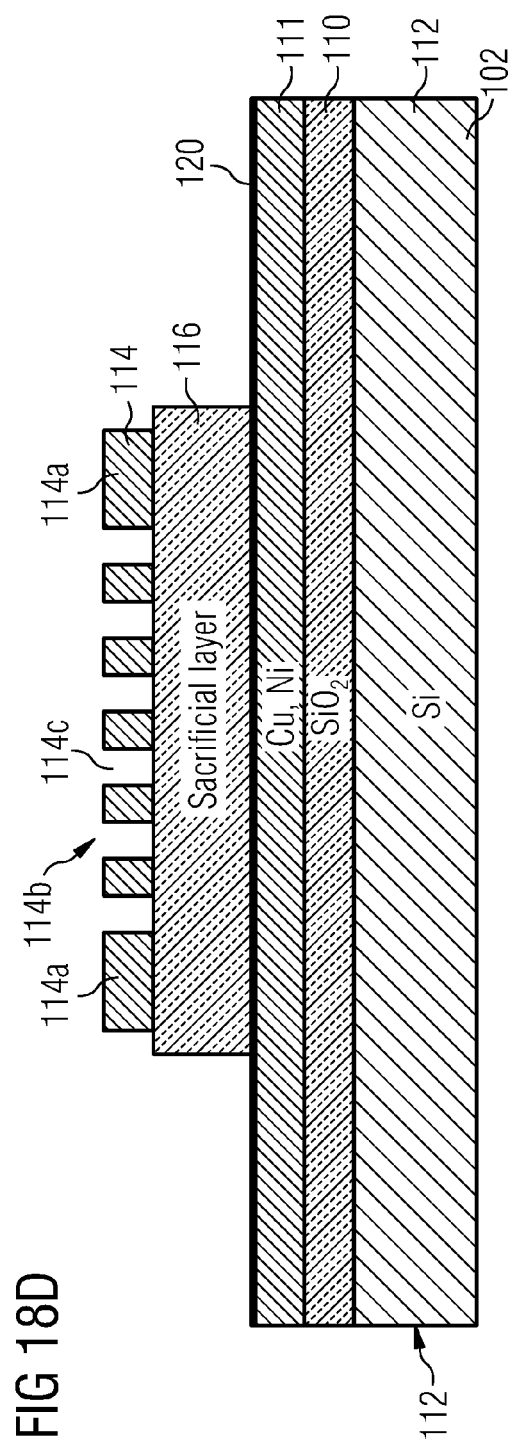

Then, the sacrificial layer 116 is patterned so as to be recessed from the periphery 112 of the substrate 102, as is shown in FIG. 18(d). Following the structuring of the sacrificial layer 116, the graphene layer 120 is patterned so as to be also recessed from the periphery 112 of the substrate 102 as is shown in FIG. 18(e). As can be seen, the graphene layer 120 is patterned so that a portion thereof extends beyond the sacrificial layer 116 so as to be exposed (not covered by the sacrificial layer 116).

Then, the metal layer 111 is patterned so as to be recessed from the periphery 112 of the substrate 102, as is shown in FIG. 18(f). The metal layer 111 is patterned so that a first portion 111a is closer to the substrate's periphery 112 than a second portion 111b. Further, the metal layer 111 is patterned so that the first portion is only partially covered by the graphene layer 120, whereas the second portion 111b is completely covered by the graphene layer 120.

In the next step, as is shown in FIG. 18(g), the insulating layer 110 is patterned so that at least a part of its peripheral region 110a is recessed from the periphery 112 of the substrate 102, thereby exposing a part 106a of the front side 106 of the substrate 102.

Contacts, e.g., metal pads, are then formed, as is shown in FIG. 18(h). The contact 122 is formed on the peripheral region 114a of the back plate 114. The contact 124 is formed on the first portion 111a of the metal layer 111. An additional contact 125 is formed on the exposed portion 106a of the substrate 102.

The substrate 102 is etched from its backside 106 in a central region 102c of the substrate 102 for defining the cavity 104 that extends from the backside 106 to the insulating layer 110, as is shown in FIG. 18(i).

In FIG. 18(j) the result of a further etching process is shown that is done from the backside 108 of the substrate and that removes a central portion 110c of the insulating layer 110 and a central portion 111c of the metal layer 111. The etch process stops at the graphene layer 120, thereby exposing a lower surface of the central, deflectable portion 120b of the graphene membrane 120. Thus, the cavity 104 extends from the backside 108 of the substrate to the graphene layer 120.

Figure 18K:
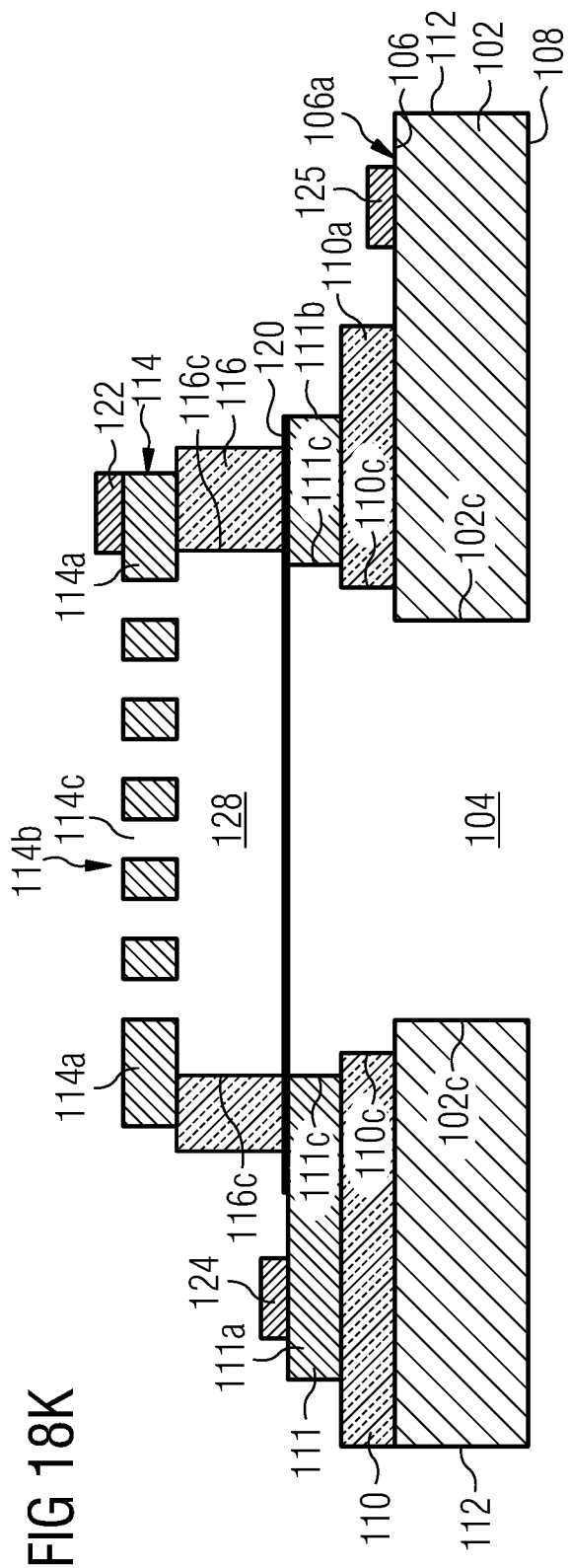

Following the etch from the back side, an etch from the front side of the substrate is done. Etching is done through the cavities 114c of the back plate 114, thereby removing a central part 116c of the sacrificial layer 116 for defining the gap 128, thereby completing the device having a structure as shown in FIG. 18(k).

In the following with reference to FIG. 19 an embodiment for manufacturing an acoustic transducer similar to the one of FIG. 18. The process is basically the same as described above, except that the process starts with the substrate 102 shown in FIG. 19(a) having on the front side 106 thereof the insulating layer 110, e.g., a $SiO_2$ layer, formed. On the surface of the insulating layer 110 facing away from the substrate 102 the graphene material 120 is deposited using a metal layer 111, e.g., a Cu layer or a Ni layer.

After a process corresponding substantially to the one described with regard to FIG. 18, the completed device as shown in FIG. 19(b) is obtained. When compared to FIG. 18(k), the difference is that the metal layer 111 has been structured such that it only remains on a part of graphene layer 120 and carries the membrane contact 124.

In the following an embodiment for manufacturing an acoustic transducer similar to the one of FIG. 9 will be described with reference to FIG. 20. The same reference signs as in FIG. 9 will be used.

Figure 20A:
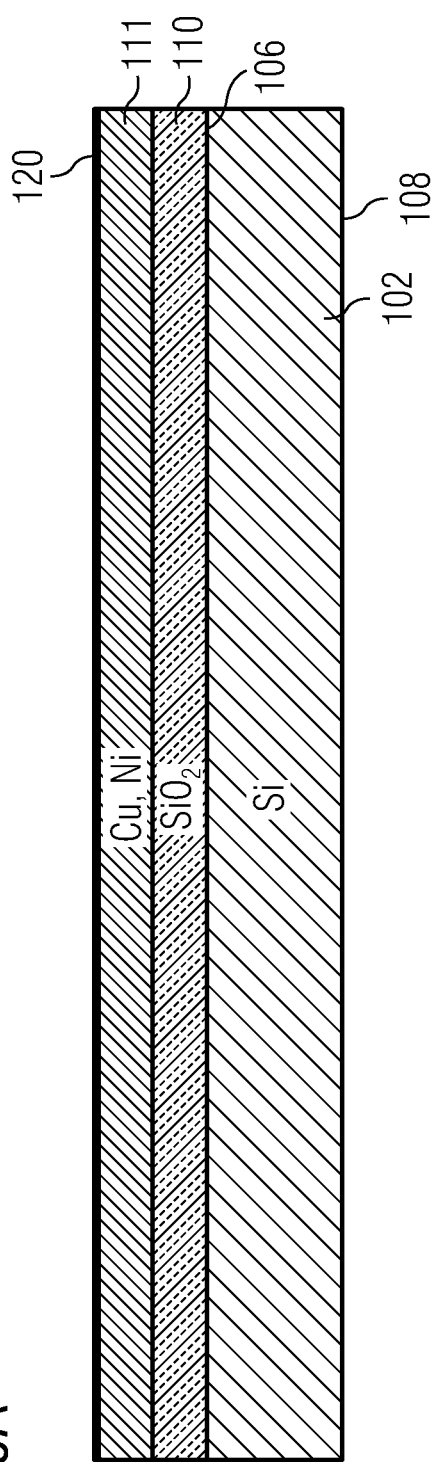

FIG. 20(a) shows the substrate 102. On the front side 106 the substrate 102 the insulating layer 110, e.g., a $SiO_2$ layer, is formed. On the surface of the insulating layer 110 facing away from the substrate 102 a metal layer 111, e.g., a Cu layer or a Ni layer, is formed. On the surface of the metal layer 111 facing away from the insulating layer 110 the graphene material 120 is deposited.

Figure 20B:
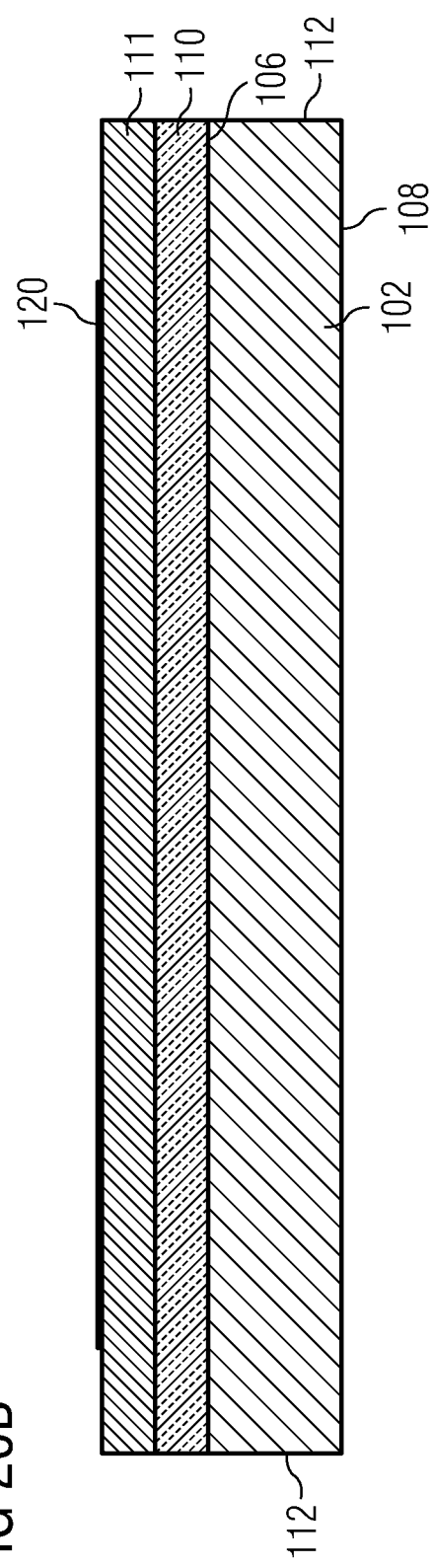

The graphene layer 120 is patterned so as to be also recessed from the periphery 112 of the substrate 102 as is shown in FIG. 20(b).

In the next step, as is shown in FIG. 20(c), the metal layer 111 is patterned so that at least a part of its peripheral region 111c is recessed from the periphery 112 of the substrate 102, thereby exposing a part 110a of the insulating layer 110.

Then, as is shown in FIG. 20(d), the insulating layer 110 is patterned so that at least a part of its peripheral region 110a is recessed from the periphery 112 of the substrate 102, thereby exposing a part 106a of the front side 106 of the substrate 102. Also contacts, e.g., metal pads, are formed. The contact 124 is formed on the first portion 111a of the metal layer 111, and the contact 150 is formed on the exposed portion 106a of the substrate 102.

The substrate 102 is etched from its backside 106 in a central region 102c of the substrate 102 for defining the cavities $104_1$ to $104_3$ that extend from the backside 106 to the insulating layer 110 and the intermediate regions $102b_1$ and $102b_2$, as is shown in FIG. 20(e).

A further etching process is done from the backside 108 of the substrate that removes a central portion of the insulating layer 110 and the metal layer 111. The etch process stops at the graphene layer 120, thereby exposing a lower surface of the central, deflectable portions $120b_1$ to $120b_3$ of the graphene membrane 120. Thus, the cavities now extend from the backside 108 of the substrate to the graphene layer 120, thereby completing the device having a structure as shown in FIG. 20(f).

For obtaining a device a shown in FIG. 11 a second wafer or substrate as shown in FIG. 21 is provided that is provided on the structure of FIG. 20(f), e.g., by wafer bonding. The substrate of FIG. 21 is obtained by providing on the front side 206 of the substrate 202 the insulating layer 210, and on the backside 208 the metal layer 220. The substrate 202 is etched to form the cavities $204_1$ to $204_3$ such that upon arranging the substrate 202 on the graphene layer 120 the cavities in the substrates are registered with each other.

FIG. 22 shows an embodiment for manufacturing an acoustic transducer similar to the one of FIG. 20. The process is basically the same as described above, except that the process starts with the substrate 102 as it is shown FIG. 19(a) having on the front side 106 thereof the insulating layer 110, e.g., a $SiO_2$ layer, is formed. On the surface of the insulating layer 110 facing away from the substrate 102 the graphene material 120 is deposited. On the surface of the graphene material 120 a metal layer 111, e.g., a Cu layer or a Ni layer, is formed.

After a process corresponding substantially to the one described with regard to FIG. 20, the completed device as shown in FIG. 22 is obtained. When compared to FIG. 20(f), the difference is that the metal layer 111 has been structured such that it only remains on a part of the graphene layer 120 and carries the membrane contact 122.

In a further embodiment, an additional substrate as the one shown in FIG. 21 can be arranged on the device of FIG. 22.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS acoustic transducer, comprising:
   a substrate having a cavity therethrough;
   a conductive back plate unit including a plurality of conductive perforated back plate portions which extend over the substrate cavity;
   dielectric spacers arranged on the back plate unit between adjacent conductive perforated back plate portions; and
   one graphene membrane supported by the dielectric spacers and extending over the conductive perforated back plate portion so that the graphene membrane comprises a plurality of deflectable areas extending over the cavity, wherein
   the conductive back plate unit comprises a plurality of adjacent cells, each perforated back plate portion comprising a perforated back plate, ad each cell including one of the perforated back plates;
   the dielectric spacers are arranged on the back plate unit between the adjacent cells;
   the graphene membrane extends over the cells of the back plate unit; and
   each of the cells of the back plate unit comprises a hexagonal shaped back plate, wherein the back plate comprises an outer hexagonal shaped frame and an inner hexagonal shaped frame, and wherein the outer frame and the inner frame are connected by a plurality of bars connected with each other at a center of the back plate, each bar extending from the center via one corner of the inner frame to one corner of the outer frame.

2. The MEMS acoustic transducer of claim 1, wherein the back plate unit comprises an array structure including a plurality of adjacent cells, each cell including a conductive perforated back plate portion, and wherein the dielectric spacers comprise discrete posts or continuous ribs arrayed between the adjacent cells of the array structure and around the array structure.

3. The MEMS acoustic transducer of claim 2, wherein the array structure comprises a honeycomb structure.

4. The MEMS acoustic transducer of claim 3, wherein the cells of the honeycomb structure comprise a diameter of about 50 μm, and wherein the number of cells is selected so as to obtain the honeycomb structure with a diameter of about 1 mm.

5. The MEMS acoustic transducer of claim 1, wherein the graphene membrane is arranged between the substrate and the conductive back plate unit.

6. The MEMS acoustic transducer of claim 1, wherein the conductive back plate unit is arranged between the substrate and the graphene membrane.

7. The MEMS acoustic transducer of claim 6, comprising a further conductive back plate unit including a plurality of conductive perforated back plate portions and arranged such that the graphene membrane is sandwiched between the conductive back plate units.

8. The MEMS acoustic transducer of claim 7, wherein the back plate units are arranged such that the respective perforated back plate portions are registered with each other.

9. The MEMS acoustic transducer of claim 7, comprising a further dielectric spacer arranged between the further back plate unit and the graphene membrane.

10. The MEMS acoustic transducer of claim 1, comprising a first electrode arranged in contact with the conductive back plate unit, and a second electrode arranged in contact with the graphene membrane.

11. The MEMS acoustic transducer of claim 1, wherein the graphene membrane comprises a single layer graphene, a multilayer graphene, a chemically functionalized single layer graphene or combinations thereof.

12. The MEMS acoustic transducer of claim 1, comprising:
   a single graphene membrane, or
   a plurality of graphene membranes, wherein a graphene membrane extends over one or more of the conductive perforated back plate portions, and wherein the plurality of graphene membranes are connected to each other.

13. The MEMS acoustic transducer of claim 1, wherein the acoustic transducer is configured as a microphone or a microspeaker.

14. The MEMS acoustic transducer of claim 1, wherein:
   the acoustic transducer comprises a MEMS microphone;
   the MEMS acoustic transducer further comprises a first electrode arranged in contact with the conductive back plate unit; and
   the MEMS acoustic transducer further comprises a second electrode arranged in contact with the graphene membrane.

15. The MEMS acoustic transducer of claim 1, wherein the outer frame has a horizontal thickness that is greater than a horizontal thickness of the inner frame, and wherein the respective bars are tapered in the direction from the outer frame towards the center.

16. The MEMS acoustic transducer of claim 1, wherein:
   the acoustic transducer comprises a MEMS microspeaker;
   the cavity comprises a plurality of cavities formed in a front side of the substrate; and
   the one graphene membrane extends over the plurality of cavities and is supported in an electrically isolated manner by the substrate and by substrate portions around the cavities.

17. The MEMS acoustic transducer of claim 16, wherein the cavities extend from the front side of the substrate to a backside of the substrate.

18. The MEMS acoustic transducer of claim 16, wherein the cavities comprise cavity walls that extend perpendicular or inclined with respect to the front side and a backside the substrate through the substrate.

19. The MEMS acoustic transducer of claim 16, wherein an opening of the cavities at the front side has a dimension different from a dimension of an opening at a backside.

20. The MEMS acoustic transducer of claim 16, wherein the cavities comprise a step-shaped or a V-shaped cross section.

21. The MEMS acoustic transducer of claim 16, comprising:
   a first electrode arranged in contact with the substrate; and
   a second electrode arranged in contact with the graphene membrane.

22. The MEMS acoustic transducer of claim 21, comprising a signal generator coupled between the first electrode and the second electrode.

23. The MEMS acoustic transducer of claim 16, comprising a plate comprising a plurality of openings and arranged electrically insulated from the graphene membrane such that the graphene membrane is sandwiched between the substrate and the plate.

24. The MEMS acoustic transducer of claim 23, comprising:
- a first electrode arranged in contact with the graphene membrane;
- a second electrode arranged in contact with the substrate;
- a third electrode arranged in contact with the plate;
- an AC signal generator coupled between the second and third electrodes; and
- a DC signal generator coupled between the first electrode and the AC signal generator.

25. The MEMS acoustic transducer of claim 16, comprising:
- a single graphene membrane, or
- a plurality of graphene membranes, wherein a graphene membrane extends over one or more of the cavities, and wherein the plurality of graphene membranes are connected to each other.

26. The MEMS acoustic transducer of claim 1, wherein:
the acoustic transducer comprises a MEMS microspeaker;
the cavity comprises a plurality of cavities extending from a front side of the substrate to a backside of the substrate;
the dielectric spacers comprise a plurality of dielectric spacers arranged on the front side of the substrate;
the one e graphene membrane comprises a graphene membrane extending over the cavities, wherein the graphene membrane is supported by the plurality of dielectric spacers arranged on substrate portions around the cavities; and
the MEMS acoustic transducer further comprises
- a first electrode arranged in contact with the substrate,
- a second electrode arranged in contact with the graphene membrane, and
- a signal generator coupled between the first and second electrodes.

27. The MEMS acoustic transducer of claim 1, wherein:
the acoustic transducer comprises an array of speakers;
the cavity comprises a plurality of cavities formed in a front side of the substrate; and
the MEMS acoustic transducer comprises a plurality of microspeakers, each microspeaker comprising the one graphene membrane extending over one or more of the plurality of cavities and supported in an electrically isolated manner by the substrate and by substrate portions around the cavities.

28. The acoustic transducer of claim 27, wherein the graphene membranes of the respective microspeakers are independent driven membranes.

* * * * *